(12) United States Patent
Koai et al.

(10) Patent No.: US 12,463,019 B2
(45) Date of Patent: Nov. 4, 2025

(54) APPARATUS FOR FABRICATING A SEMICONDUCTOR STRUCTURE AND METHOD OF FABRICATING A SEMICONDUCTOR STRUCTURE

(71) Applicant: TAIWAN SEMICONDUCTOR MANUFACTURING COMPANY LTD., Hsinchu (TW)

(72) Inventors: Keith Kuang-Kuo Koai, Hsinchu County (TW); Shih-Kuo Liu, Nantou County (TW); Wen-Chih Wang, New Taipei (TW); Hsin-Liang Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 584 days.

(21) Appl. No.: 17/815,236

(22) Filed: Jul. 27, 2022

(65) Prior Publication Data

US 2022/0359169 A1   Nov. 10, 2022

Related U.S. Application Data

(62) Division of application No. 16/583,066, filed on Sep. 25, 2019, now Pat. No. 11,443,923.

(51) Int. Cl.
*H01J 37/32* (2006.01)
*H01L 21/02* (2006.01)
*H01L 21/3065* (2006.01)
*H01L 21/687* (2006.01)

(52) U.S. Cl.
CPC .. *H01J 37/32642* (2013.01); *H01L 21/02019* (2013.01); *H01L 21/3065* (2013.01); *H01L 21/68721* (2013.01); *H01L 21/68742* (2013.01)

(58) Field of Classification Search
CPC ................................. H01J 37/32642
See application file for complete search history.

(56) References Cited

U.S. PATENT DOCUMENTS

| | | | |
|---|---|---|---|
| 2016/0211166 A1* | 7/2016 | Yan | H01L 21/67069 |
| 2017/0213758 A1* | 7/2017 | Rice | H01J 37/32082 |
| 2019/0067019 A1* | 2/2019 | Tabata | H01L 21/022 |
| 2019/0355557 A1* | 11/2019 | Moriya | G01S 17/06 |
| 2020/0013657 A1* | 1/2020 | Lee | H01L 21/67242 |
| 2020/0335368 A1* | 10/2020 | Pan | H01L 22/12 |

\* cited by examiner

*Primary Examiner* — Binh X Tran
(74) *Attorney, Agent, or Firm* — WPAT LAW; Anthony King

(57) ABSTRACT

The present disclosure provides a method for fabricating a semiconductor structure, including placing a wafer on a chuck, wherein the wafer is surrounded by a focus ring, the focus ring is supported by a first actuator, wherein the first actuator is in a cavity defined by the chuck and the edge ring, wherein the first actuator includes an outer ring disposed in the cavity, a piezoelectric layer apart from a top surface of the cavity, wherein an edge of the piezoelectric layer is fixed by the outer ring, and an inner ring disposed in the chamber at a center portion of the piezoelectric layer, performing plasma etch on a surface of the wafer, and controlling a distance between a gas distribution plate and a top surface of the focus ring to be less than a threshold value by the first actuator.

20 Claims, 22 Drawing Sheets

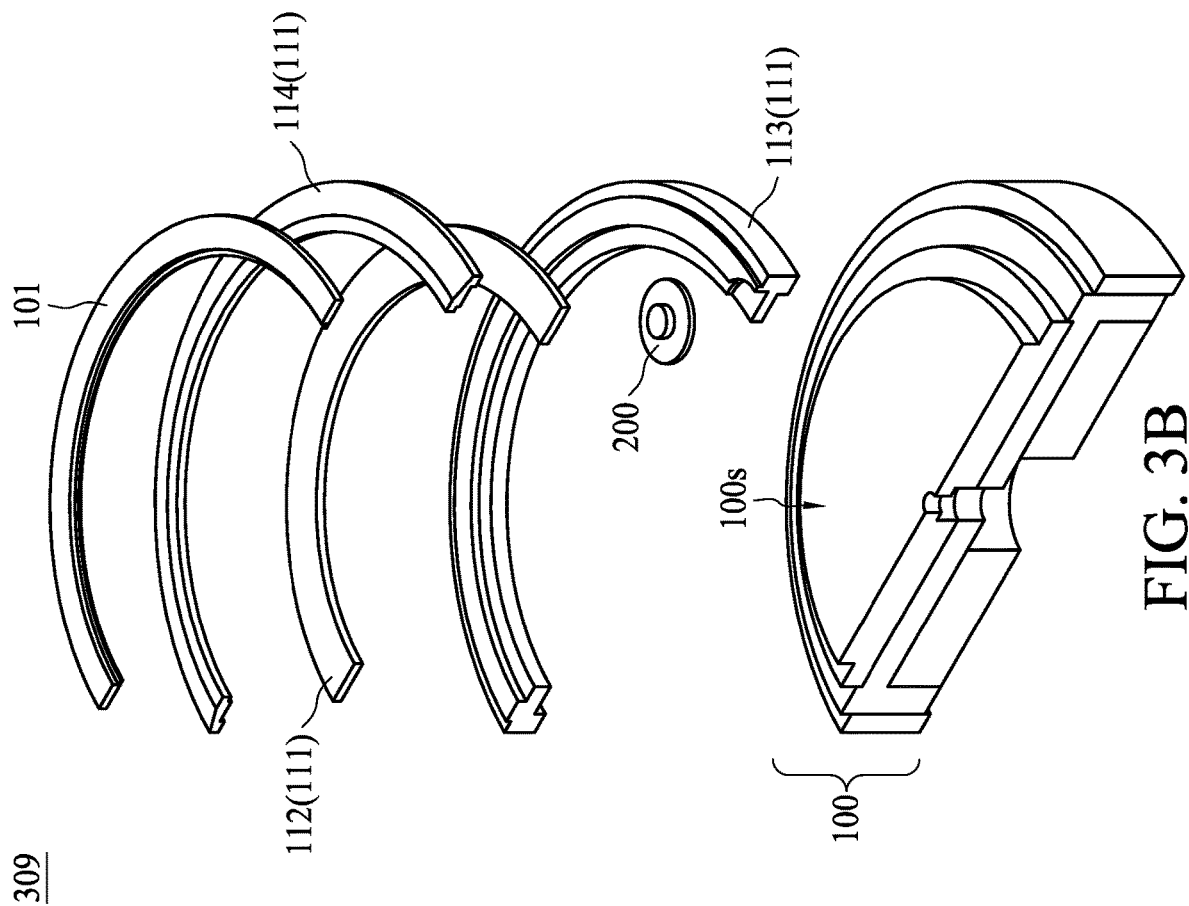

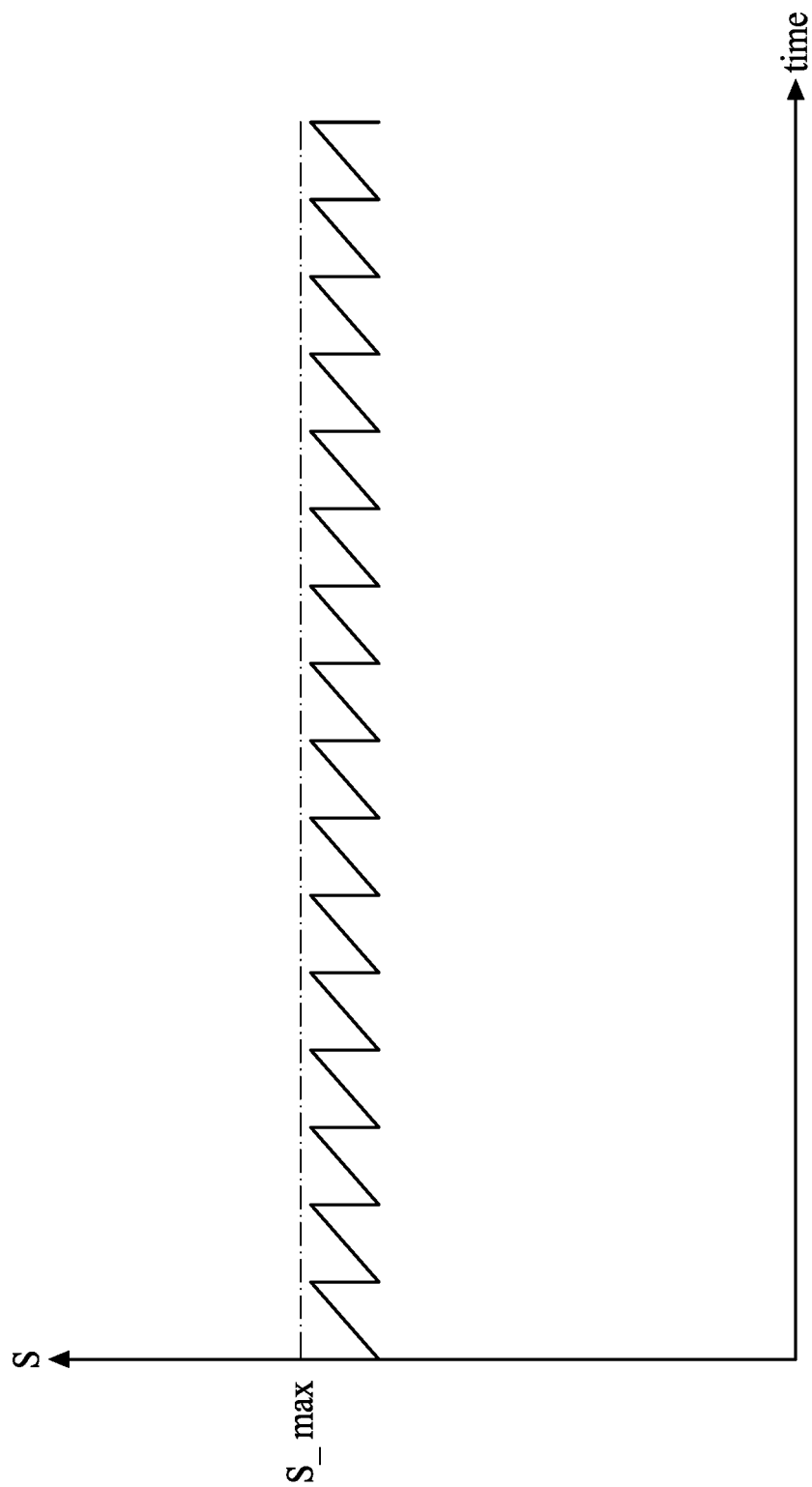

APPARATUS FOR FABRICATING A SEMICONDUCTOR STRUCTURE AND METHOD OF FABRICATING A SEMICONDUCTOR STRUCTURE

CROSS REFERENCE TO RELATED APPLICATIONS

This application is a divisional application of application Ser. No. 16/583,066, filed on Sep. 25, 2019.

BACKGROUND

Semiconductor devices are used in a variety of electronic applications, such as, for example, personal computers, cell phones, digital cameras, or other electronic equipment. The semiconductor industry continues to improve the integration density of various types of electronic components (e.g. diodes, transistors, resistors, capacitors, etc.) by reducing the critical dimension of features. However, some problems may arise during the development.

Fabricating semiconductor devices often entail plasma operations. For example, plasma etching operation, aching, plasma-enhanced deposition are some of the widely used operations. Improving the yield rate of device fabrication involving plasma operation is one of the problems to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a schematic drawing illustrating an exploded view of a portion of a wafer supporter, according to some embodiments of the present disclosure.

DETAILED DESCRIPTION

Figure 1:
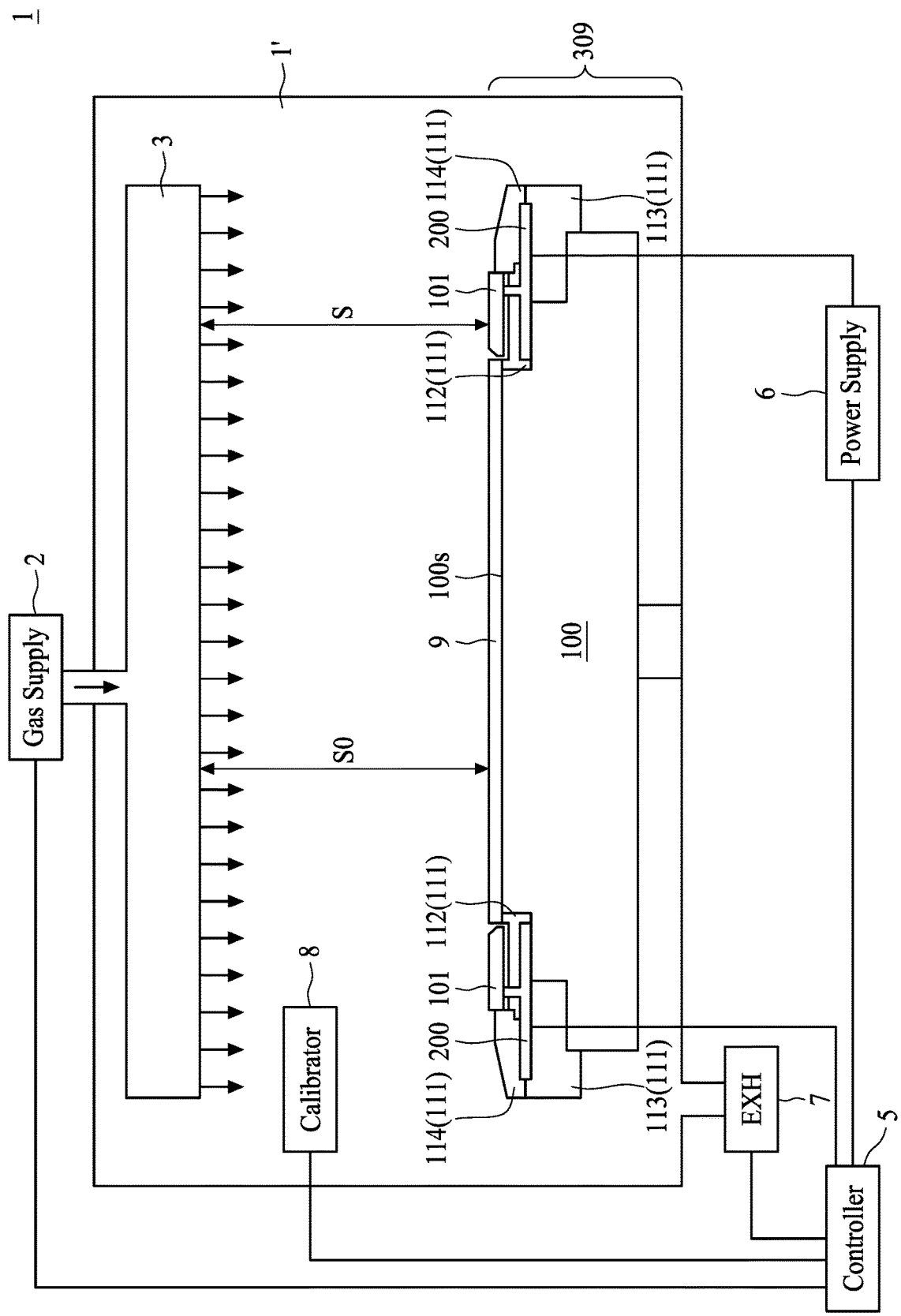
FIG. 1 is a schematic drawing illustrating a plasma operation apparatus, according to some embodiments of the present disclosure.
Figure 2:
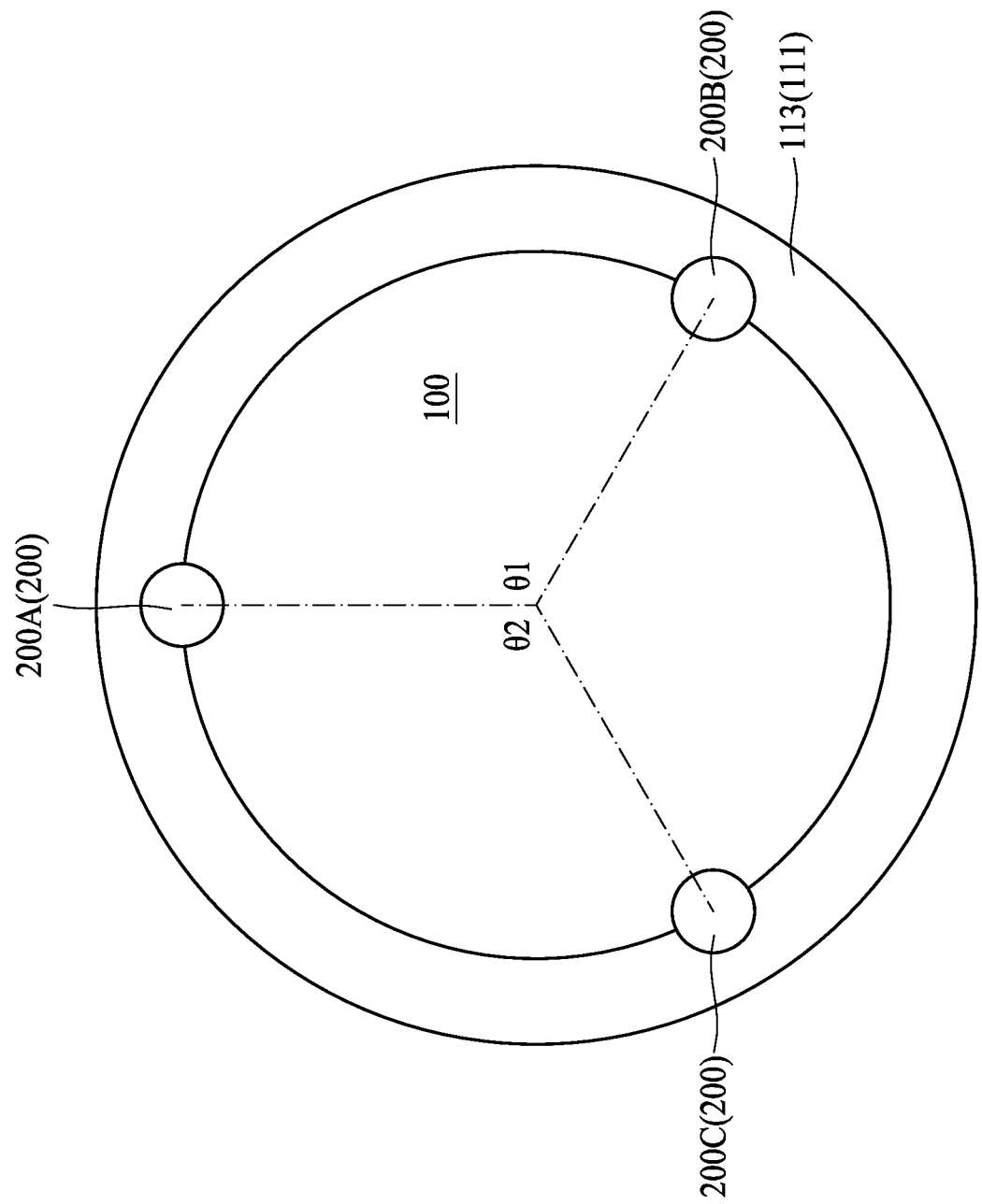
FIG. 2 is a schematic drawing illustrating a top view of a wafer supporter, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Fabricating a semiconductor device may entail operations involving plasma, such as plasma etching operation, ashing operation, plasma-enhanced deposition operation, or the like. Generally a wafer can be disposed in a plasma operation apparatus, and plasma is generated in the apparatus and applied to a surface of the wafer.

During a plasma operation, the phenomenon of wafer edge etching profile tilt (or in some cases, fringing effect) may be induced due to discontinuous/non-uniform bias potential at the peripheral area of the wafer. Specifically, if a distance between a wafer and a gas distribution plate abruptly changes (increases/decreases) at a specific position (e.g. wafer peripheral), plasma sheath bending may occur thereat. Such condition may cause non-uniformity profile of fabricated devices (e.g. tilted structure, distorted structure, mis-sized structure, shifted pattern, etc.), especially in the peripheral area of the wafer, and thereby deteriorate yield rate of fabricated device. In some embodiments, the plasma apparatus may include a focus ring surrounding the wafer to improve the uniformity of plasma operation. Specifically, by disposing a focus ring around the wafer, the phenomenon of wafer edge etching profile tilt can be alleviated due to a reduced difference of a distance between a wafer and a gas distribution plate at a peripheral area of the wafer and an outer area directly outside of the wafer, wherein the discontinuous bias potential can be reduced.

However, challenges of incorporating a focus ring to a plasma operation apparatus may arise since the focus ring may suffer material loss due to the bombardment of plasma ions. Such material loss over the time may cause the difference of distances between the focus ring and a gas distribution plate over the focus ring and the wafer, local plasma sheath bending may consequently occur, causing a tilt in wafer edge etching profile. As a result, frequently replacing the focus ring may be entailed to at least prevent the wafer edge etching profile tilt. However, frequently replacing the focus ring may be time-consuming and labor-consuming.

The present disclosure provides an apparatus for fabricating a semiconductor structure and a method for fabricating a semiconductor structure in order to alleviate the wafer edge etching profile tilt, which often occurs at the peripheral area of the wafer. Furthermore, the life cycle of the focus ring may be increased, thereby reducing the consumption of time and/or labor force. It should be noted that in some embodiments of the present disclosure, the plasma etching operation is provided as an example. However, the present disclosure is not limited to be applied to device fabrication involving plasma etching operation(s). The apparatus and method provided in the present disclosure can also be applied to any other device fabrication involving plasma operation, such as ashing, plasma-enhanced deposition, plasma removal, other deposition or etching operations, or any other operations involving applying plasma to a surface of a substrate.

Referring to FIG. 1, FIG. 1 is a schematic drawing illustrating a plasma operation apparatus, according to some embodiments of the present disclosure. A plasma operation system 1 at least includes a chamber 1', a controller 5, and a wafer supporter 309 configured to support a wafer 9 in the chamber 1'. A gas supply 2 is coupled to the chamber 1', wherein the controller 5 controls the flow rate of gas supplied into the chamber 1'. In some embodiments, the gas may include carrier gas and/or reactants (such as etchants) involved in an operation to be performed by the plasma operation system 1. In some embodiments, the gas supplied by the gas supply 2 is transmitted into the chamber 1' through a gas distribution plate (GDP) 3 including a plurality of apertures over the wafer supporter 309, thereby improving the uniformity of distributing the supplied gas and the uniformity of generated plasma generated in the chamber 1'. Optionally, the plasma operation system 1 further include an gas exhaust 7 for removing gas from the chamber 1', wherein the rate of exhaustion may be controlled by the controller 5.

In some embodiments, a coil around the chamber 1' can be utilized to generate plasma. Alternatively, the chamber 1' may include an upper RF generator and an upper electrode coupled to the upper RF generator, and further include a lower RF generator and a lower electrode coupled to the lower RF generator. By being electrically biased, the incoming gas may be ignited into plasma. It should be noted that the method of generating plasma is not limited in the present disclosure, wherein any suitable method for generating plasma can be utilized. The components for generating plasma may be connected to the controller 5 in order to control the generation of plasma.

Figure 3A:
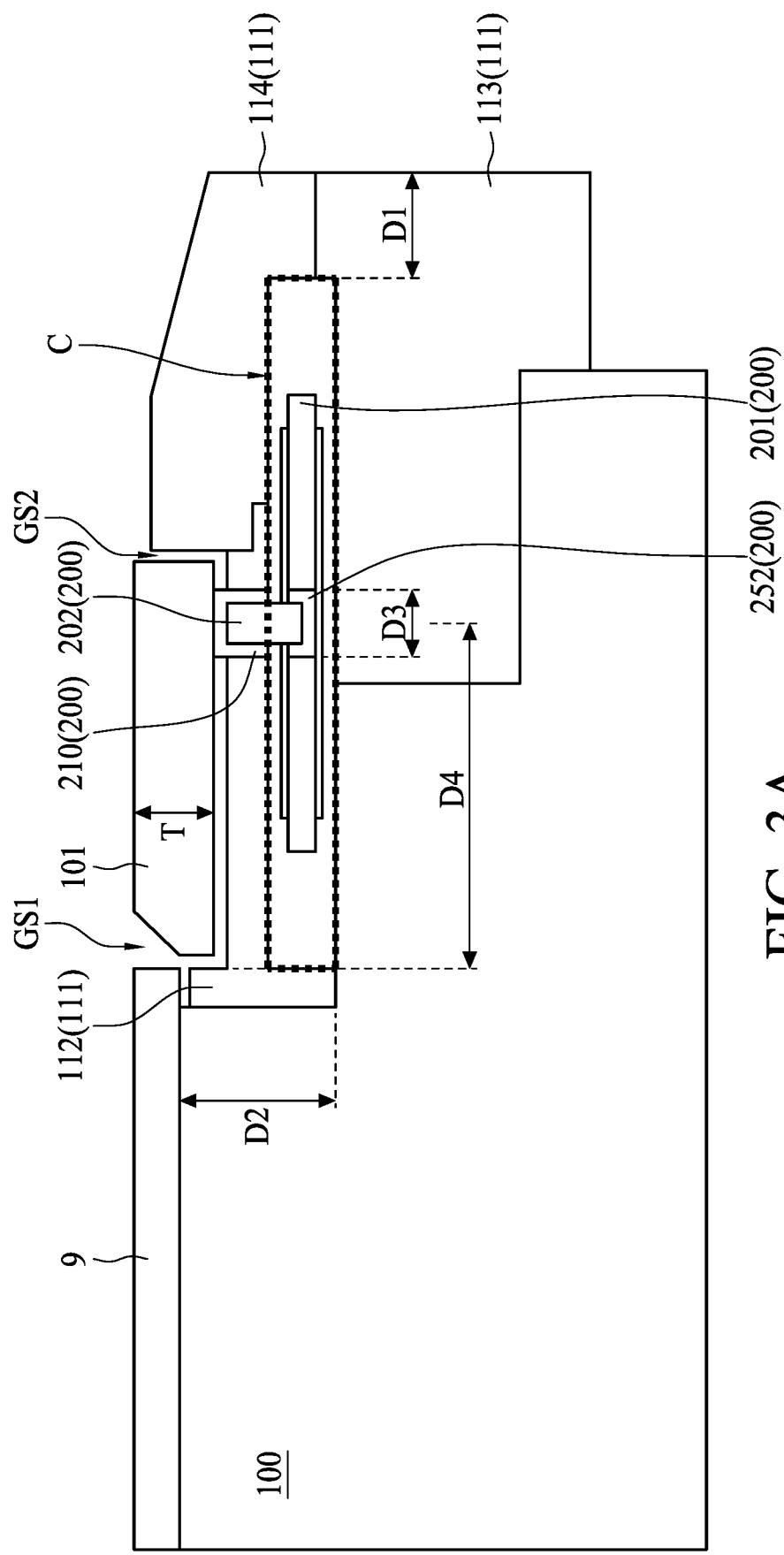
FIG. 3A is a schematic drawing illustrating an enlarged cross sectional view of a portion of a wafer supporter, according to some embodiments of the present disclosure.

Referring to FIG. 1, FIG. 2, FIG. 3A and FIG. 3B, FIG. 2 is a schematic drawing illustrating a top view of a wafer supporter, FIG. 3A is a schematic drawing illustrating an enlarged cross sectional view of a portion of a wafer supporter, FIG. 3B is a schematic drawing illustrating an exploded view of a portion of a wafer supporter, according to some embodiments of the present disclosure. The wafer supporter 309 at least includes a chuck 100 configured to secure the wafer 9 (such as an electrostatic chuck, or the like), an actuator 200, and a focus ring 101. The focus ring 101 is adjacent to and surrounding the chuck 100 of the wafer supporter 309; and when a wafer 9 is supported by the wafer supporter 309, an edge of the wafer 9 is surrounded by the focus ring 101. In some of the embodiments, the focus ring 101 includes silicon or silicon derivatives, such as single crystal silicon, or other suitable material. The wafer supporter 309 may further include an edge ring 111 surrounding the chuck 100 and the focus ring 101, wherein the focus ring 101 is over a portion of the edge ring W. Alternatively stated, a portion of the edge ring 111 is between the focus ring 101 and the chuck 100. In some of the embodiments, the edge ring 111 may include quartz. In some of the embodiments, the edge ring 111 may include multiple portions. For example, the edge ring 111 may include a focus ring quartz portion 112 surrounding an edge of the chuck 100, wherein the focus ring quartz portion 112 has a portion under the focus ring 101 and between the focus ring 101 and the chuck 100, and/or a portion laterally adjacent to the focus ring 101 and between the focus ring 101 and the chuck 100. The edge ring 111 may further include a cover ring quartz portion 114 surrounding an outer sidewall of the focus ring 101 and/or an outer sidewall/a top surface of the focus ring quartz portion 112. The edge ring 111 may further include an insulator ring portion 113 under the cover ring quartz portion 114 and focus ring quartz portion 112, wherein a portion of the insulator ring portion 113 is between the chuck 100 and a bottom surface of the focus ring quartz portion 112 and/or a portion of the cover ring quartz portion 114. In some of the embodiments, the focus ring quartz portion 112, the insulator ring portion 113 and/or the cover ring quartz portion 114 may include quartz. It should be noted that the composition of the edge ring 111 in the present disclosure is not limited to the aforementioned example of including the focus ring quartz portion 112, the insulator ring portion 113 and/or the cover ring quartz portion 114. Any other suitable rings for supporting the focus ring 101 may be utilized as the edge ring 111. A first gap separation GS1 is between a sidewall of the wafer 9 (when placed on the chuck 100) and an inner sidewall of the focus ring 101, and a second gap separation GS2 is between an outer sidewall of the focus ring 101 and an inner sidewall of the edge ring 111, thereby alleviating the risk of particle issues by avoiding friction between the aforesaid two relative moving surfaces. In some embodiments, a dimension of the second gap separation GS2 is in a range from about 0.15 mm to about 0.4 mm.

The edge ring 111 further includes a cavity C and an actuator 200 disposed inside the cavity C. In some the embodiments of edge ring 111 including the focus ring quartz portion 112, the insulator ring portion 113 and the cover ring quartz portion 114, the cavity C is surrounded by the focus ring quartz portion 112, the insulator ring portion 113 and/or the cover ring quartz portion 114. The actuator 200 is engaged with a back surface of the focus ring 111, wherein the actuator 200 may include a lift pin 202 configured to apply force to support the focus ring 111. Optionally, the actuator 200 further include a lift pin cap 210 at least partially surrounds and covers an outer surface of the lift pin 202, and the lift pin cap 210 directly contacts the back surface of the focus ring 111, wherein the lift pin cap 210 may include insulation material to alleviate damage caused by discharge, such as Teflon, ceramic, silicon, quartz, or any other suitable insulation material. For an exemplary embodiment, a smallest dimension D1 between an outer surface of the edge ring 111 and the actuator 200 is in a range from about 4.925 mm to about 5.125 mm, wherein a mechanical strength of the edge ring 111 adjacent to the cavity C is robust enough while provide a large enough cavity C for accommodating the actuator 200. A distance D2 between a top surface 100s of the chuck 100 (or bottom surface of the wafer 9) and a bottom surface of the actuator 200 is in a range from about 10.25 mm to about 12.25 mm. A dimension D3 (or a diameter) of a top surface of the lift pin cap 210 may be in a range from about 7.2 mm to about 9.2 mm, which provide adequate insulation and enough mechanical strength to support the focus ring 111. A distance D4 between a center of the actuator 200 (or a center of the lift pin 202) and a sidewall of the wafer 9 (when placed on the chuck 100) is in a range from about 24.9 mm to about 26.9 mm. It should be noted that the aforementioned dimension or distance may be adjusted based on the structure or material of the wafer supporter 309.

In some embodiments, the wafer supporter 309 includes more than one actuator 200 to improve the balance when supporting or lifting the wafer 9 by the focus ring 111 engaging with the wafer 9, wherein each of the actuator 200 are substantially leveled at a same imaginary plane (i.e. the top surfaces of each of the lift pin 202 of each actuator 200 are substantially leveled at a same imaginary plane), wherein each of a planar angle measured between each two of the actuators 200 with respect to a center of the chuck 100 is substantially identical. As shown in the example provided in FIG. 2, the wafer supporter 309 includes three actuators 200 (a first actuator 200A, a second actuator 200B and a third actuator 200C) leveled at a same imaginary plane to provide more balanced supporting force, wherein a first planar angle θ1 measured between the first actuator 200A and the second actuator 200B is substantially identical with a second planar angle θ2 measured between the first actuator 200A and the third actuator 200C. In the case of the wafer supporter 309 including three actuators 200, the first planar angle θ1 and the second planar angle θ2 may be around 120 degree.

Figure 4A:
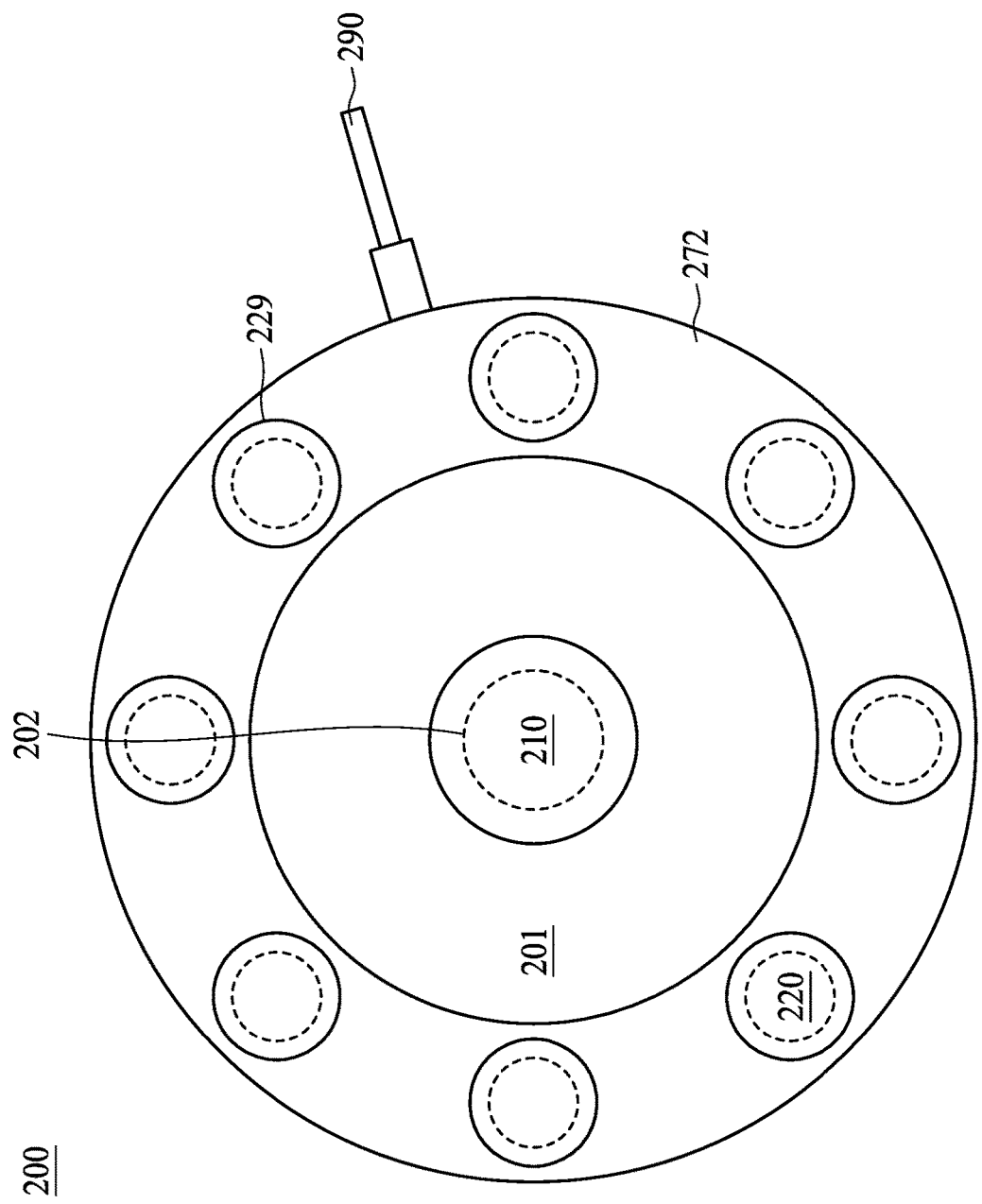
FIG. 4A is a schematic drawing illustrating a top view of an actuator, according to some embodiments of the present disclosure.
Figure 4B:
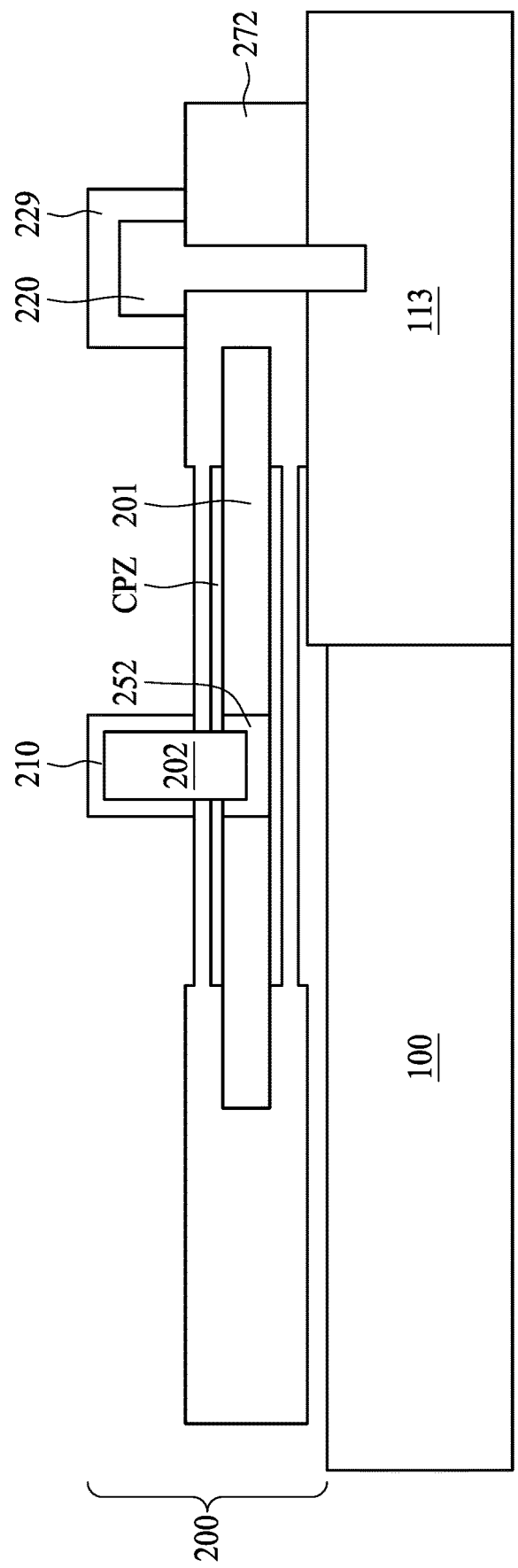
FIG. 4B is a schematic drawing illustrating a cross sectional view of an actuator, according to some embodiments of the present disclosure.

Referring to FIG. 1, FIG. 3A, FIG. 3B, FIG. 4A and FIG. 4B, FIG. 4A is a schematic drawing illustrating a top view of an actuator, FIG. 4B is a schematic drawing illustrating a cross sectional view of an actuator, according to some embodiments of the present disclosure. In some embodiments, the actuator 200 may be a piezoelectric transducer component, which at least includes a piezoelectric layer 201. In some embodiments, an edge of the piezoelectric layer 201 is fixed by an outer ring 272. In some embodiments, the outer ring 272 is made from metal. Alternatively in some other embodiments, the outer ring 272 includes insulation materials, such as insulating ceramic material. An inner ring 252 is optionally disposed at a center of the piezoelectric layer 201, and the lift pin 202 is disposed above the inner ring 252 (or a center of the piezoelectric layer 201), wherein the inner ring 252 may include metal, such as stainless steel. In some embodiments, the actuator 200 may include a chamber CPZ, wherein at least a portion of the piezoelectric layer 201 is in the chamber CPZ, the chamber CPZ may have a chamber pressure lower than standard pressure (for example, less than 100 mTorr), and the sidewalls of the chamber CPZ may include metal thus capable of bearing the difference of pressure between environment and the chamber CPZ.

The controller 5 may control the power supply 6 to apply a voltage to the piezoelectric layer 201 through a wire 290, which is connected to the piezoelectric layer 201, thereby a displacement profile of the piezoelectric layer 201 can be controlled by adjusting voltage applied thereon. Since an edge of the piezoelectric layer 201 is fixed, the center of the piezoelectric layer 201 may deform upwardly and its displacement is greater than a displacement at the edge area when applied by a voltage, thereby lifting the lift pin 202 and apply a force at the backside of the focus ring 101 through the lift pin cap 210. For example, a range of operable voltage of the actuator 200 supplied by the power supply 6 is in a range from 0V to about 1,000V, and the corresponding displacement of a top surface of the lift pin 202 is in a range from about 0 micron to about 140 micron, or in some other examples from 0 micron to 300 micron. Vice versa, when the power supply 6 stops providing voltage to the actuator 200 (i.e. back to 0V), the deformation at the center area decreases. In some cases, since the phenomena of hysteresis cycle may occur to the piezoelectric layer 201, the aforesaid relationship between the displacement and the supplied voltage may thereby become non-linear. Therefore, in some embodiments, subsequent to an occurrence of reducing supplied power or shut down of the actuator 200, a calibration operation may be performed to improve the linearity of a relationship between the displacement and the supplied voltage in the subsequent cycle, thereby improve the accuracy of controlling.

In some embodiments, in order to facilitate the adhesion between the actuator 200 and the edge ring 111 as well as the balance of the actuator 200, one or more screw 220 can be utilized to fix the outer ring 272 of the actuator 200 to the edge ring 111 (such as the insulator ring portion 113). Furthermore, in order to alleviate particle issues or scratches caused by direct contact between the screw 220 and edge ring 111 (such as the focus ring quartz portion 112 and/or the cover ring quartz portion 114), a screw cap 229 can be utilized to at least partially covers the screw head of the screw 220. In some embodiments, the screw cap 229 may include silicon.

Figure 4C:
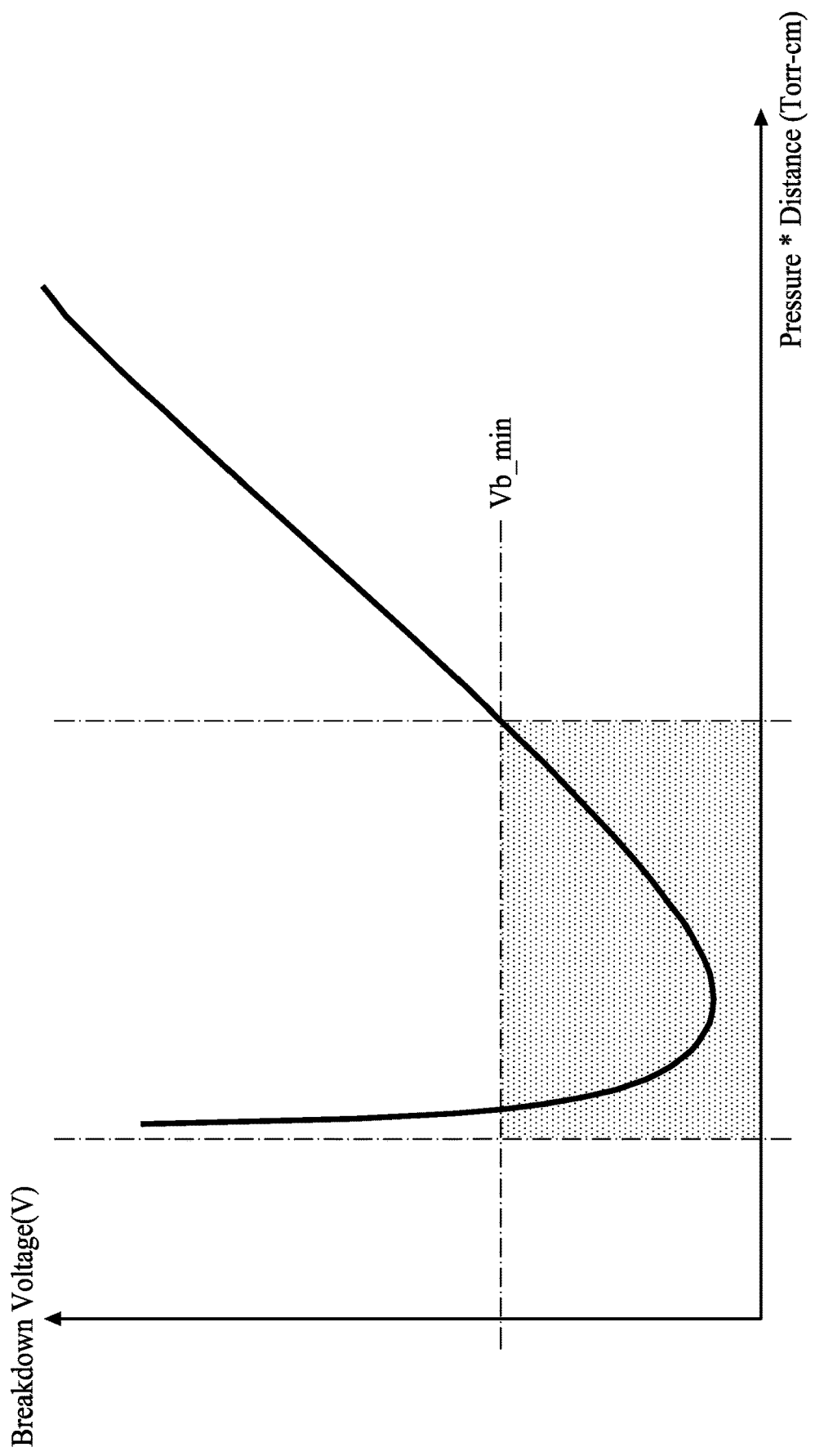
FIG. 4C is a diagram illustrating a relationship between breakdown voltage and a product of chamber gas pressure multiplied by a distance between a chuck and an actuator, according to some embodiments of the present disclosure.

Referring to FIG. 4C, FIG. 4C is a diagram illustrating a relationship between breakdown voltage and a product of chamber gas pressure multiplied by a distance between a chuck and an actuator, according to some embodiments of the present disclosure. In some embodiments, since the chuck 100 is electrically biased, the actuator(s) 200 is electrically isolated from the chuck 100 to alleviate electrical discharge (such as arcing) or electrical interference. In some embodiments, a distance is spacing between the actuator(s) 200 and the chuck 100. In some embodiments, the distance is in a range from about 0.08 cm to about 0.2 cm. According to a relationship between breakdown voltage and a product of chamber gas pressure in chamber CPZ multiplied by the distance between a chuck 100 and the actuator 200 (as shown in FIG. 4C), when the product of chamber gas pressure in chamber CPZ multiplied by the distance is within a range (for example, from about 0.1 Torr-cm to about 100 Torr-cm), the breakdown voltage may be lower than a minimum threshold breakdown voltage Vb_min. When the breakdown voltage is less than Vb_min, arcing or electrical discharge may be easily induced and cause damage. Accordingly, in order to alleviate arcing or electrical discharge, the distance between the actuator 200 and the chuck 100 is greater than certain value (such as greater than about 008 cm). On the other hand, actuator 200 and the chuck 100 not being spaced too far (such as less than about 0.2 cm) can save space from the aspect of assembly configuration. However, it should be noted that the distance can be adjusted according to the chamber gas pressure in chamber CPZ. In some other embodiments, the actuator is performed with an insulating treatment, e.g. forming a dielectric film coating on its surface, such as performing plasma spray of ceramic powder to form an insulation layer, wherein a thickness of such insulation layer may be in a range from about 50 micron to 100 micron. In some other embodiments, the chuck 100 is subjected to similar insulating treatment, such as performing plasma spray of ceramic powder to form an insulation layer, wherein a thickness of such insulation layer may be in a range from about 50 micron to 100 micron. Alternatively, by choosing ceramic as a material of the chuck 100, the actuator(s) 200 and/or the outer body 272 of the actuator 200 can be electrically isolated from the chuck 100, thereby electrical discharge can be alleviated.

Referring back to FIG. 1 and FIG. 3A, optionally, the plasma operation system 1 further includes a calibrator S configured to monitor a distance S0 between the GDP 3 and the top surface of the wafer 9, a distance S between the GDP 3 and a top surface of the focus ring 101, and/or a thickness T of the focus ring 101. In some embodiments, a strain gauge can be incorporated into the actuator 200, such as attached or coupled to the piezoelectric layer 201. In some of the embodiments, the strain gauge can be attached to a surface (such as a side surface, a back surface, or a front surface) or inside of the piezoelectric layer 201. The strain gauge may readily detect the extent of deformation of the piezoelectric layer 201, thereby the aforesaid displacement can be provided as feedback instantly for a purpose of calibration. The obtained information may be transmitted to the controller 5. The controller 5 in the present disclosure can be implemented by software such that the foregoing methods disclosed therein can be automatically performed. For a given computer, the software routines can be stored on a storage device, such as a permanent memory. Alternately, the software routines can be machine executable instructions stored using any machine readable storage medium, such as a diskette, CD-ROM, magnetic tape, digital video or versatile disk (DVD), laser disk, ROM, flash memory, etc. The series of instructions could be received from a remote storage device, such as a server on a network. The present invention can also be implemented in hardware systems, microcontroller unit (MCU) modules, discrete hardware or firmware. Furthermore, the controller 5 may include a timer and/or a memory to store a preset schedule. In some embodiments, the calibrator 8 may include an acoustic transceiver for obtaining the distance S between the top surface of the focus ring 101 and a bottom surface of the GDP 3. In some embodiments, the calibrator 8 may include a device (such as an optical monitor) for obtaining a thickness of the focus ring 101.

It should be noted that although plasma etching operation are provided as examples in FIG. 5A to FIG. 8C, the operation of plasma etching can be substituted by/combined with other plasma operations, such as ashing, plasma-enhanced deposition (such as plasma enhanced chemical vapor deposition), or the like.

Figure 5A:
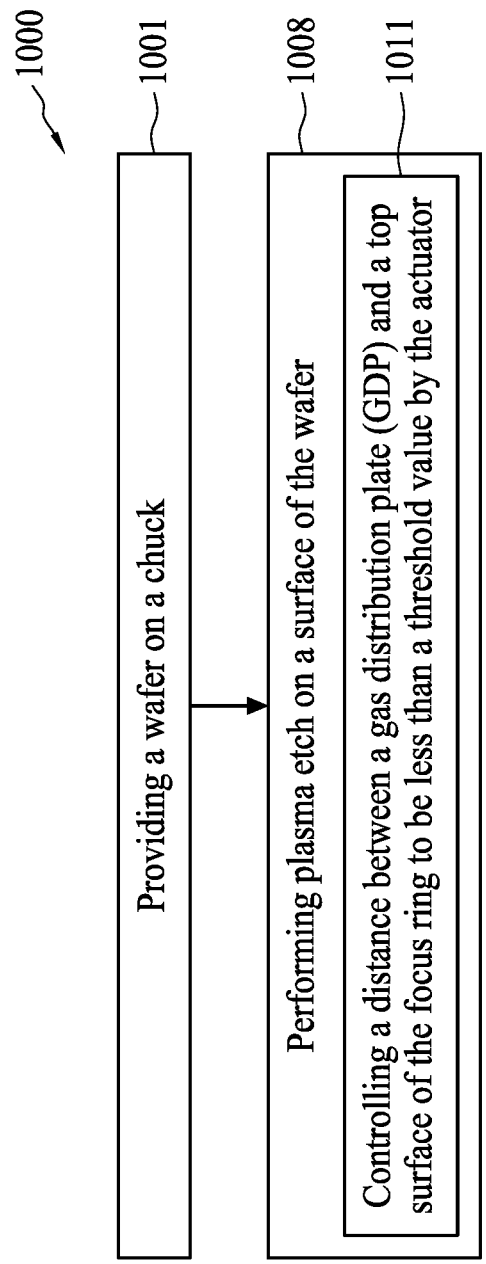
FIG. 5A shows a flow chart representing a method for fabricating a semiconductors structure, in accordance with some embodiments of the present disclosure.

Referring to FIG. 5A, FIG. 5A shows a flow chart representing a method for fabricating a semiconductor structure, in accordance with some embodiments of the present disclosure. The method 1000 for fabricating a semiconductor structure includes providing a wafer on a chuck (operation 1001, which can be referred to FIG. 1 or FIG. 6A), and performing plasma etch on a surface of the wafer (operation 1008, which can be referred to FIG. 6A). The operation 1008 may include controlling a distance between a gas distribution plate (GDP) and a top surface of the focus ring to be less than a threshold value by the actuator (sub-operation 1011, which can be referred to FIG. 6A to FIG. 6B and FIG. 7A or FIG. 7A').

Figure 5B:
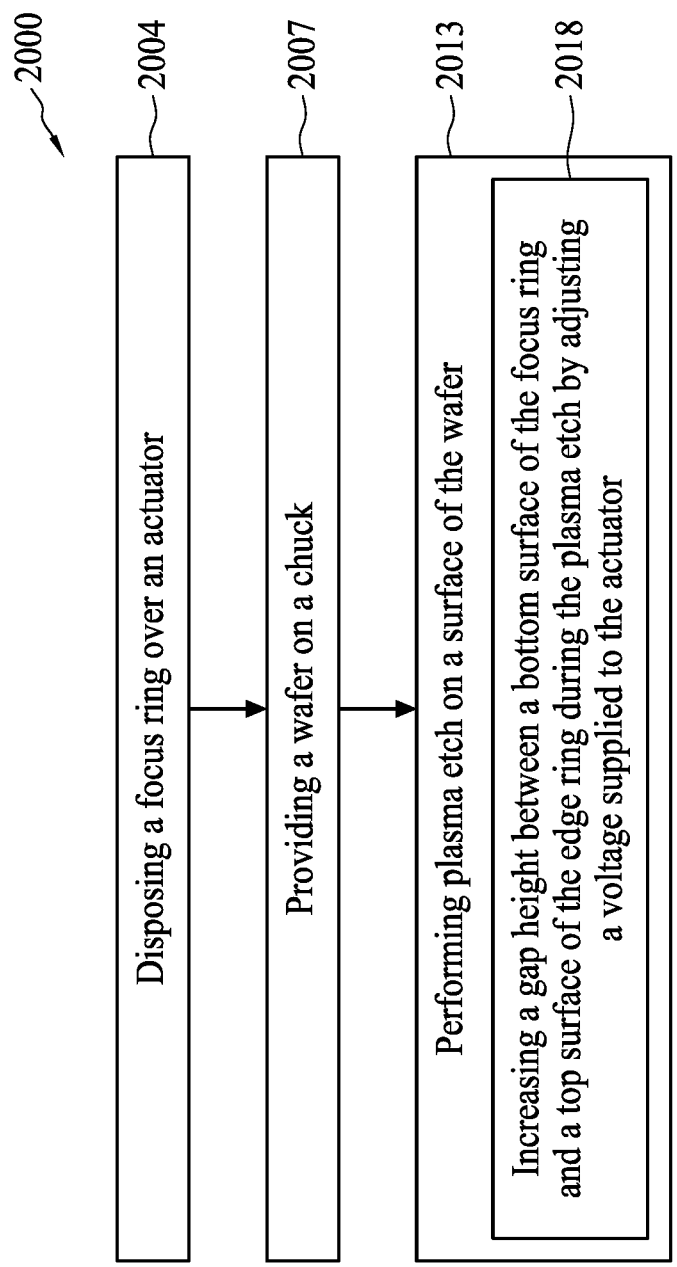
FIG. 5B shows a flow chart representing a method for fabricating a semiconductor structure, in accordance with some embodiments of the present disclosure.

Referring to FIG. 5B, FIG. 5B shows a flow chart representing a method for fabricating a semiconductor structure, in accordance with some embodiments of the present disclosure. The method 2000 for fabricating a semiconductor structure includes disposing a focus ring over an actuator (operation 2004, which can be referred to FIG. 1 or FIG. 6A), providing a wafer on a chuck (operation 2007, which can be referred to FIG. 6A), and performing plasma etch on a surface of the wafer (operation 2013, which can be referred to FIG. 6A to FIG. 6B). The operation 2013 may include increasing a gap height between a bottom surface of the focus ring and a top surface of the edge ring during the plasma etch by adjusting a voltage supplied to the actuator (sub-operation 2018, which can be referred to FIG. 6A to FIG. 6B and FIG. 7A or FIG. 7A').

Figure 5C:
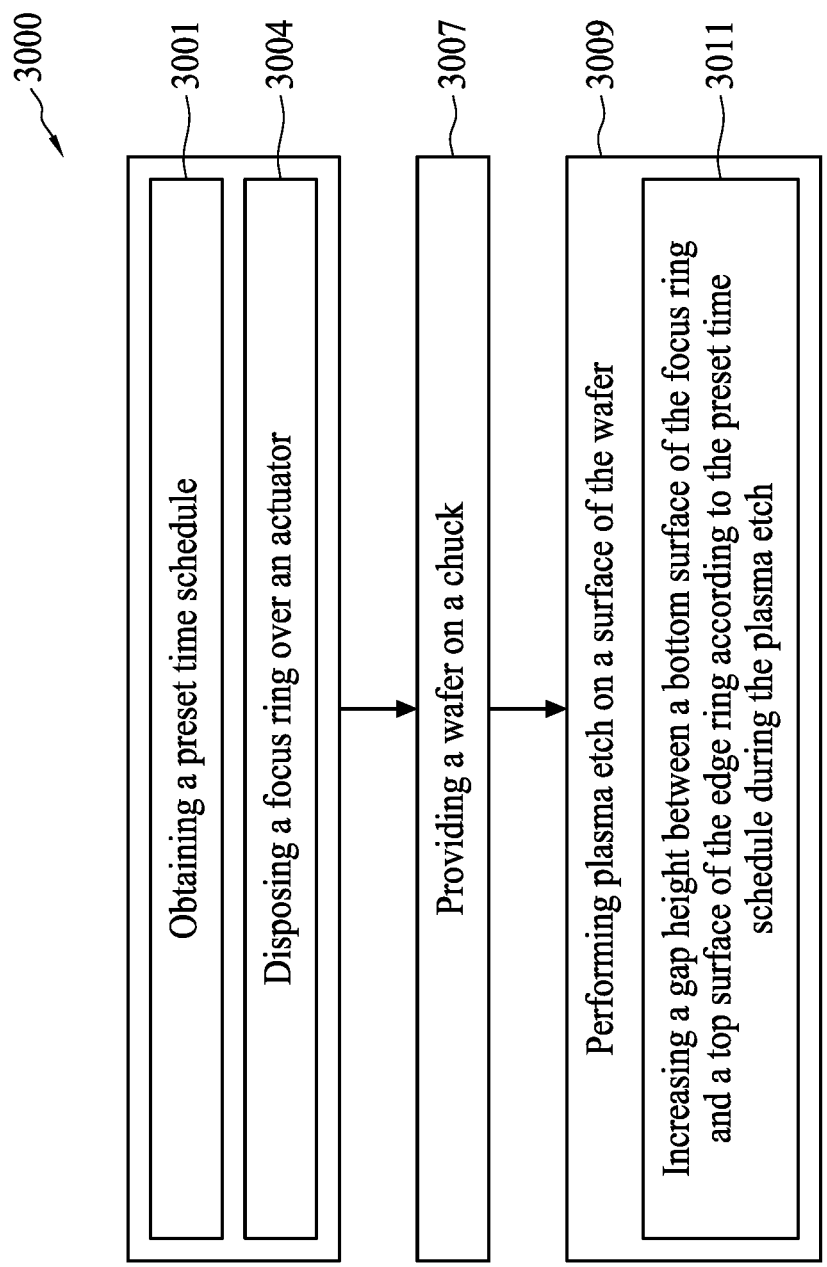
FIG. 5C shows a flow chart representing a method for fabricating a semiconductor structure, in accordance with some embodiments of the present disclosure.

Referring to FIG. 5C, FIG. 5C shows a flow chart representing a method for fabricating a semiconductor structure, in accordance with some embodiments of the present disclosure. The method 3000 for fabricating a semiconductor structure includes obtaining a preset time schedule (operation 3001, which can be referred to FIG. 6A), disposing a focus ring over an actuator (operation 3004, which can be referred to FIG. 1 or FIG. 6A), providing a wafer on a chuck (operation 3007, which can be referred to FIG. 1 or FIG. 6A) and performing plasma etch on a surface of the wafer (operation 3009, which can be referred to FIG. 6A to FIG. 6B). The operation 3009 may include increasing a gap height between a bottom surface of the focus ring and a top surface of the edge ring according to the preset time schedule during the plasma etch (sub-operation 3011, which can be referred to FIG. 6A to FIG. 6B).

Figure 5D:
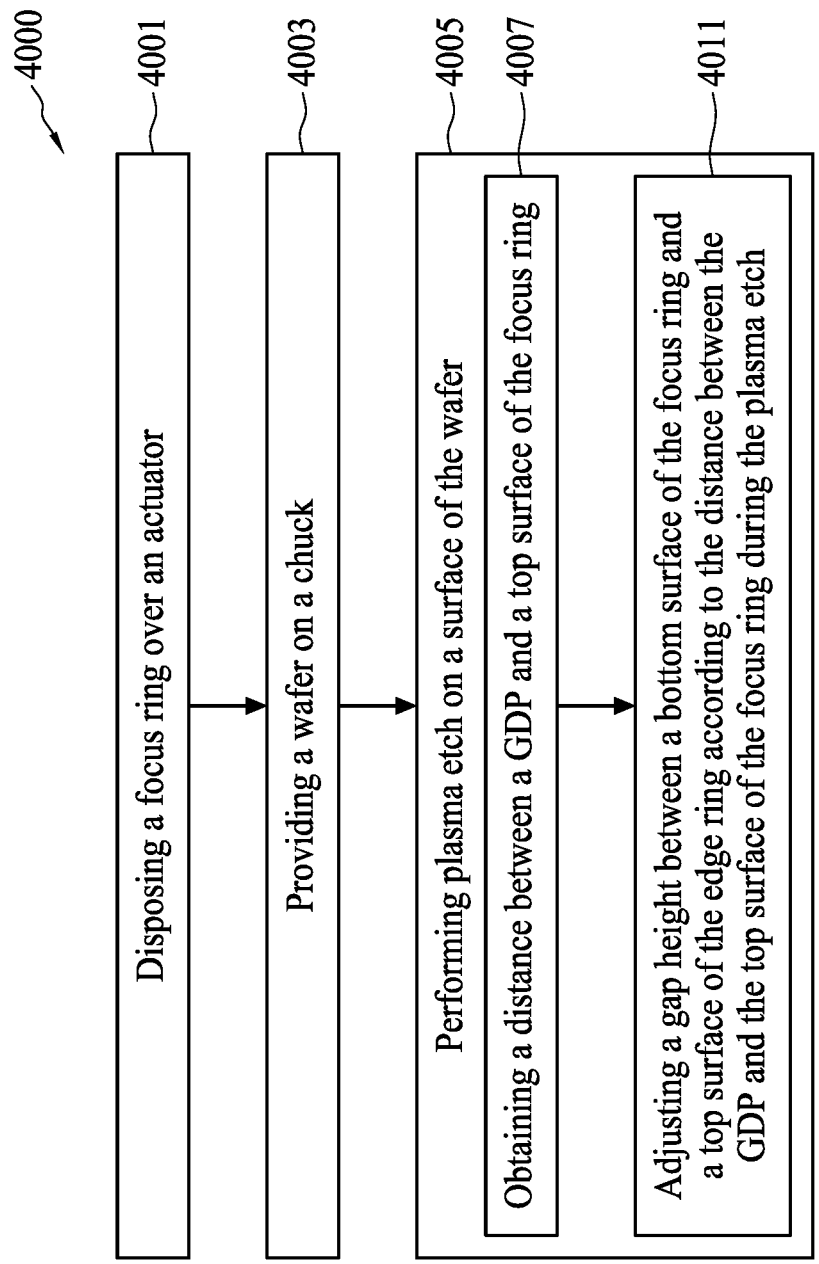
FIG. 5D shows a flow chart representing a method for fabricating a semiconductor structure, in accordance with some embodiments of the present disclosure.

Referring to FIG. 5D, FIG. 5D shows a flow chart representing a method for fabricating a semiconductor structure, in accordance with some embodiments of the present disclosure. The method 4000 for fabricating a semiconductor structure includes disposing a focus ring over an actuator (operation 4001, which can be referred to FIG. 1 or FIG. 6A), providing a wafer on a chuck (operation 4003, which can be referred to FIG. 1 or FIG. 6A) and performing plasma etch on a surface of the wafer (operation 4005, which can be referred to FIG. 6A to FIG. 68). The operation 4005 may include obtaining a distance between a GDP and a top surface of the focus ring (sub-operation 4007, which can be referred to FIG. 1 and FIG. 6A to FIG. 6B) and adjusting a gap height between a bottom surface of the focus ring and a top surface of the edge ring according to the distance between the GDP and the top surface of the focus ring during the plasma etch (sub-operation 4011, which can be referred to FIG. 6A to FIG. 6B and FIG. 78 or FIG. 7W).

Figure 5E:
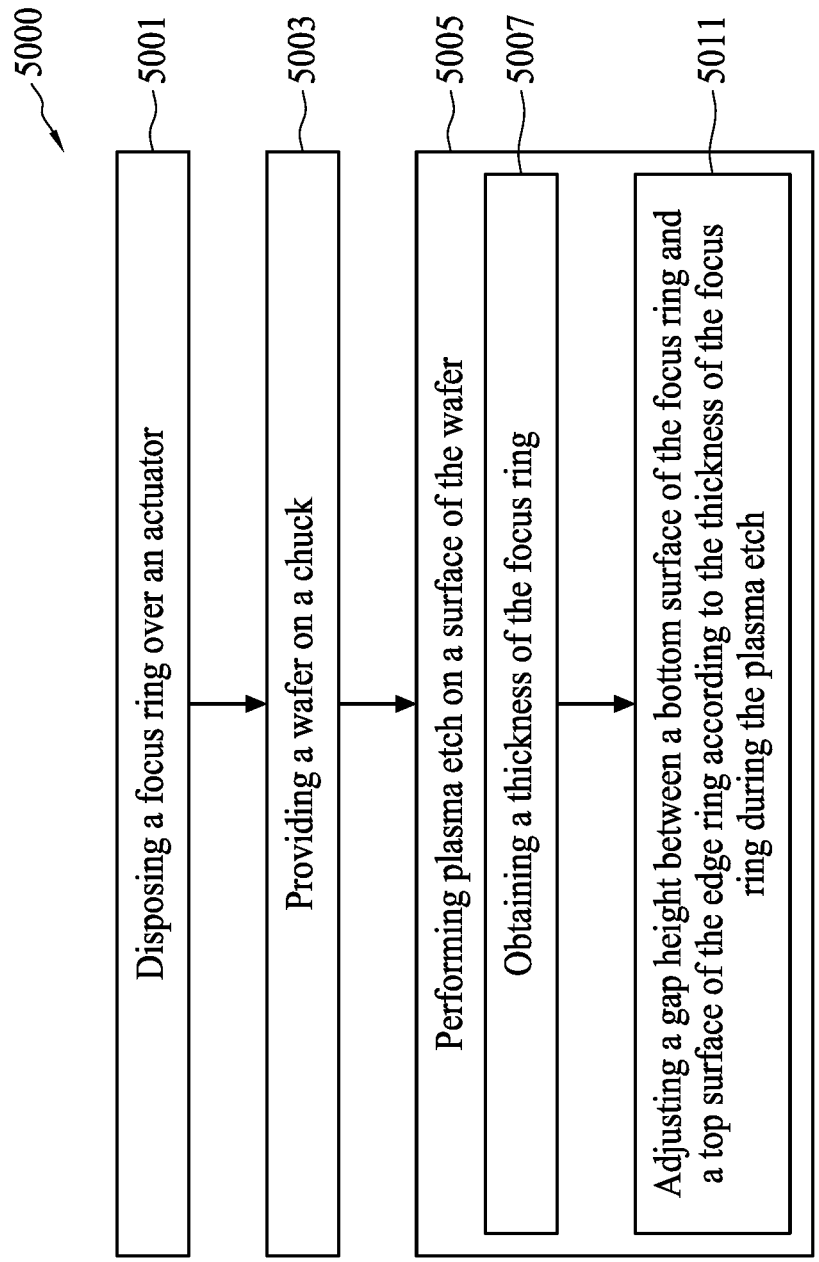
FIG. 5E shows a flow chart representing a method for fabricating a semiconductor structure, in accordance with some embodiments of the present disclosure.

Referring to FIG. 5E, FIG. 5E shows a flow chart representing a method for fabricating a semiconductor structure, in accordance with some embodiments of the present disclosure. The method 5000 for fabricating a semiconductor structure includes disposing a focus ring over an actuator (operation 5001, which can be referred to FIG. 1 or FIG. 6A), providing a wafer on a chuck (operation 5003, which can be referred to FIG. 1 or FIG. 6A) and performing plasma etch on a surface of the wafer (operation 5005, which can be referred to FIG. 6A to FIG. 6B). The operation 5005 may include obtaining a thickness of the focus ring (sub-operation 5007, which can be referred to FIG. 1 and FIG. 6A to FIG. 6B) and adjusting a gap height between a bottom surface of the focus ring and a top surface of the edge ring according to the thickness of the focus ring during the plasma etch (sub-operation 5011, which can be referred to FIG. 6A to FIG. 6B and FIG. 7C).

Figure 6A:
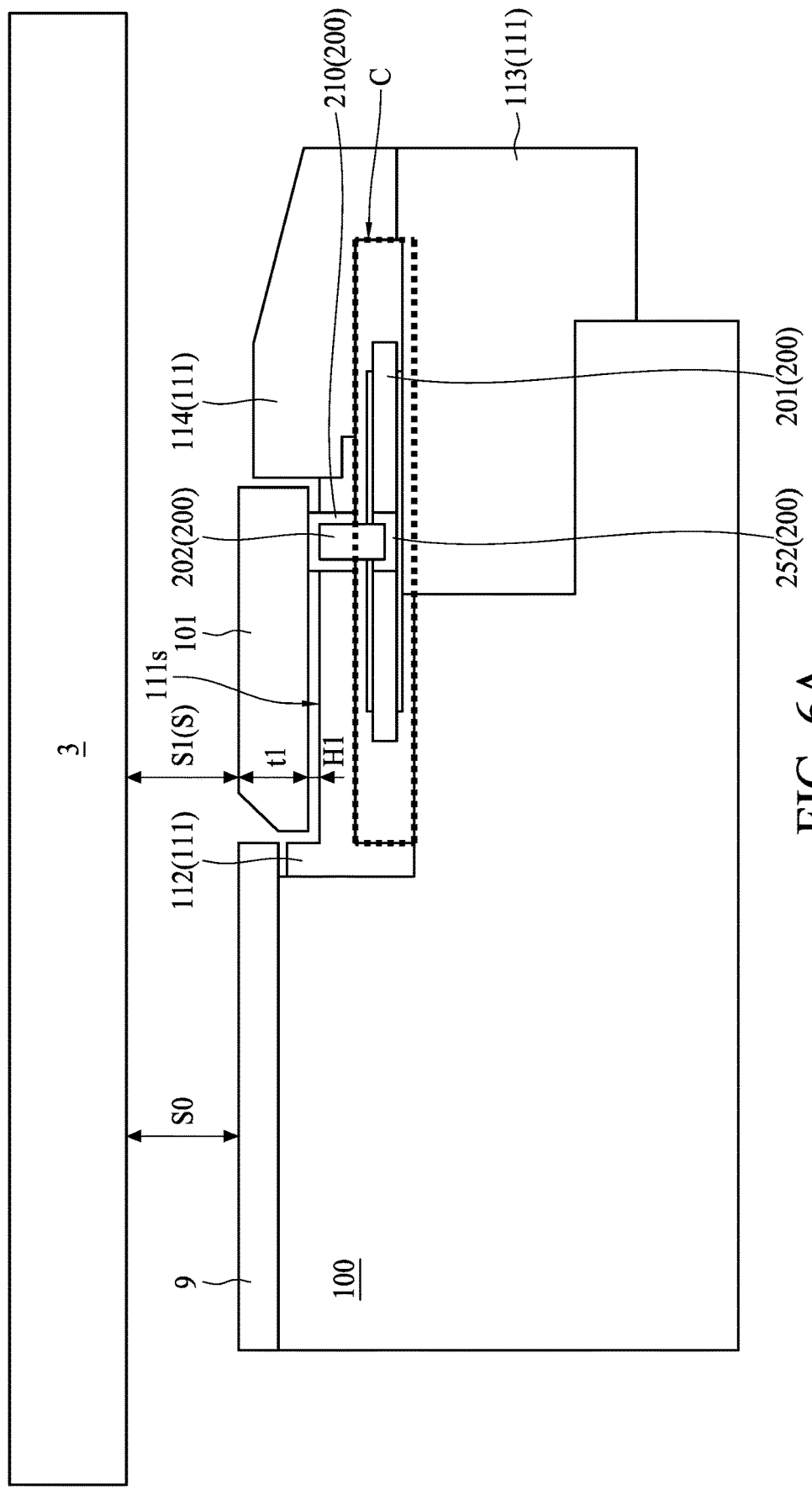
FIG. 6A is a schematic drawing illustrating an enlarged cross sectional view of a portion of a wafer supporter and a portion of a gas distribution plate, according to some embodiments of the present disclosure.
Figure 6B:
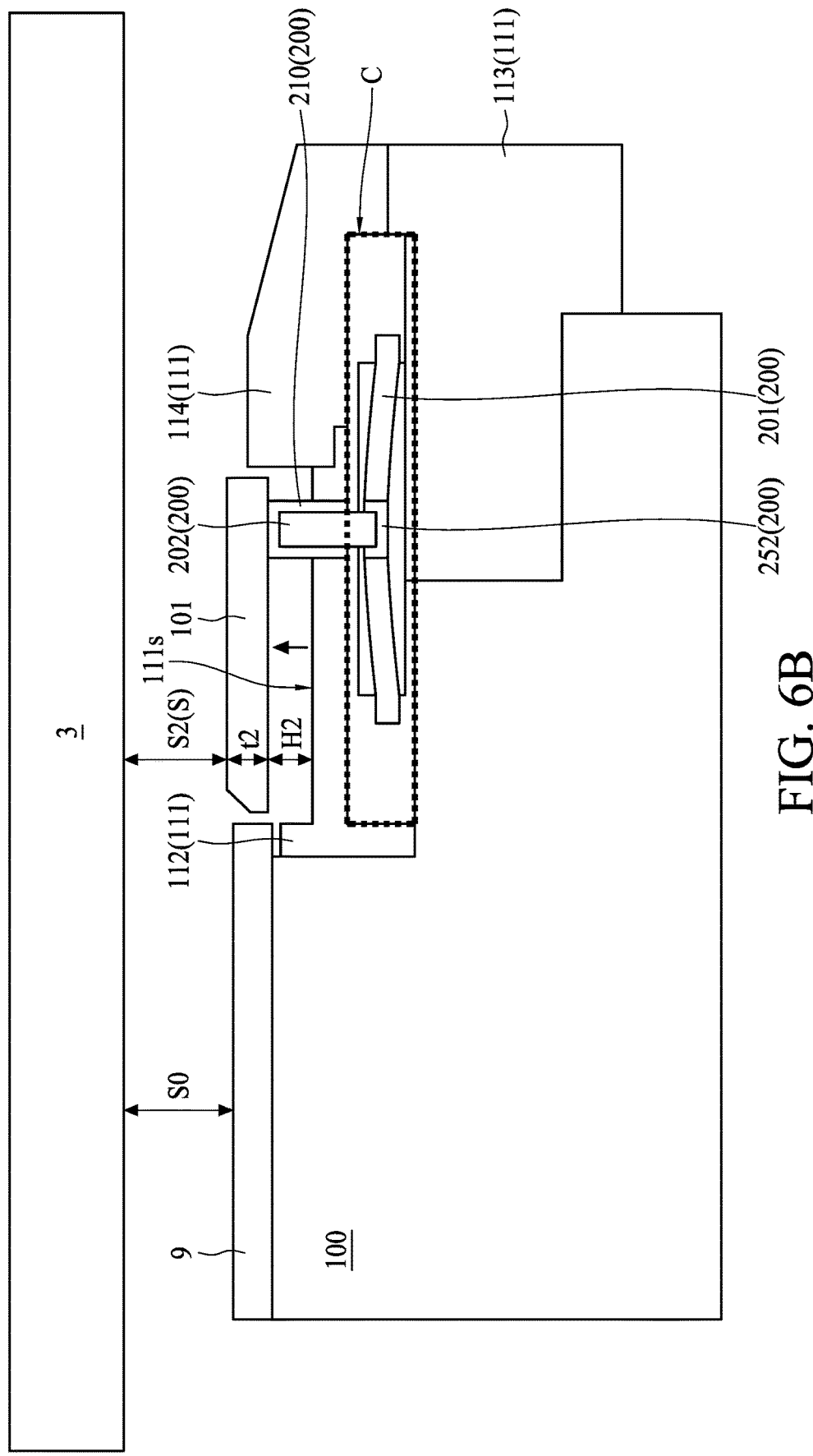
FIG. 6B is a schematic drawing illustrating an enlarged cross sectional view of a portion of a wafer supporter and a portion of a gas distribution plate, according to some embodiments of the present disclosure.

Referring to FIG. 1, FIG. 6A and FIG. 6B, FIG. 6A is a schematic drawing illustrating an enlarged cross sectional view of a portion of a wafer supporter and a portion of a gas distribution plate, FIG. 6B is a schematic drawing illustrating an enlarged cross sectional view of a portion of a wafer supporter and a portion of a gas distribution plate, according to some embodiments of the present disclosure. At least one actuator 200 is disposed in a cavity C of the edge ring 111 of the wafer supporter 309. In some embodiments, after combining the focus ring quartz portion 112, the insulator ring portion 113 and the cover ring quartz portion 114, a cavity C is thereby formed. A focus ring 101 is subsequently disposed on the actuator 200, with a back surface of the focus ring 101 engaging with a top surface of the lift pin cap 210 (or the lift pin 202). A wafer 9 is provided and disposed on the chuck 100 of the wafer supporter 309, wherein a distance S0 between the top surface of the wafer 9 and a bottom surface of a GDP 3 above the wafer supporter 309 and a distance S is between the top surface of the focus ring 101 and a bottom surface of the GDP 3. Prior to performing a plasma operation, such as plasma etching operation is performed on the wafer 9, a top surface of the wafer 9 is, or adjusted to be, substantially leveled with a top surface of the focus ring 101. Alternatively stated, the distance S between the top surface of the focus ring 101 and a bottom surface of the GDP 3 is adjusted to become S1, which as substantially identical with the distance S0 between the top surface of the wafer 9 and the bottom surface of a GDP 3. Furthermore, the focus ring 101 has an initial thickness t1, and an initial gap height H1 is between the bottom surface of the focus ring 101 and a top surface of the edge ring 111 (or specifically in some examples, the focus ring quartz portion 112 of the edge ring 111). Thence a plasma operation, such as plasma etching operation is performed on the wafer 9, wherein gas is supplied through GDP 3 in order to generate plasma in the chamber P. In some embodiments, the power supply provides an initial voltage V1 to the actuator 200 at the start of the plasma etching operation. In some embodiments, V1 is 0V. In some other embodiments, V1 is greater than 0V but lower than maximum operable voltage (such as 1,000V).

During performing plasma etch on the wafer 9, the controller 5 controls and adjusts the distance S between the top surface of the focus ring 101 and the bottom surface of the GDP 3 by adjusting the voltage supplied by the power supply 6 to the actuator 200. By providing a voltage V2 greater than V1 during performing plasma etch on the wafer 9, a displacement of a center portion of a piezoelectric layer 201 expands and thereby lifts the lift pin 202 disposed thereon and the focus ring 101 engaging with the lift pin 202. Specifically, since a thickness T of the focus ring 101 may be reduced during plasma etch operation, for example reduced to t2 less than t1, thus the gap height 111 between the bottom surface of the focus ring 101 and a top surface of the edge ring 111 is increased to H2 greater than H1, thereby reducing the difference between the distance S0 and the distance S during plasma etch operation. Thereby the phenomenon of wafer edge etching profile tilt may be alleviated. Alternatively stated, the displacement of a top surface the lift pin 202 compensates the loss of thickness T of the focus ring 101 during plasma etch operation.

Figure 7A:
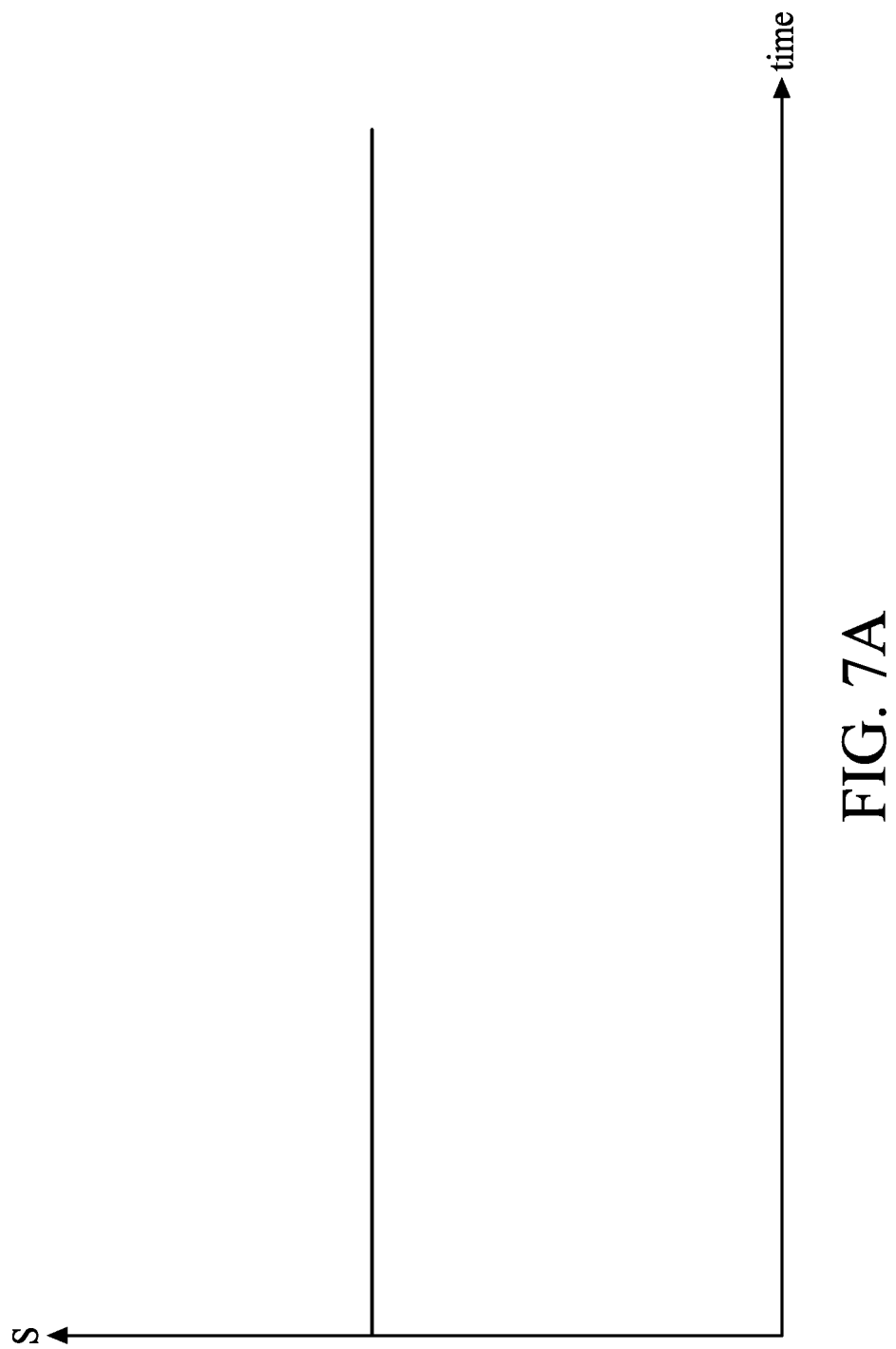
FIG. 7A is a diagram illustrating a relationship between a total plasma etching operation time and a distance between a top surface of an edge ring and a bottom surface of a focus ring, according to some embodiments of the present disclosure.
Figure 7B:
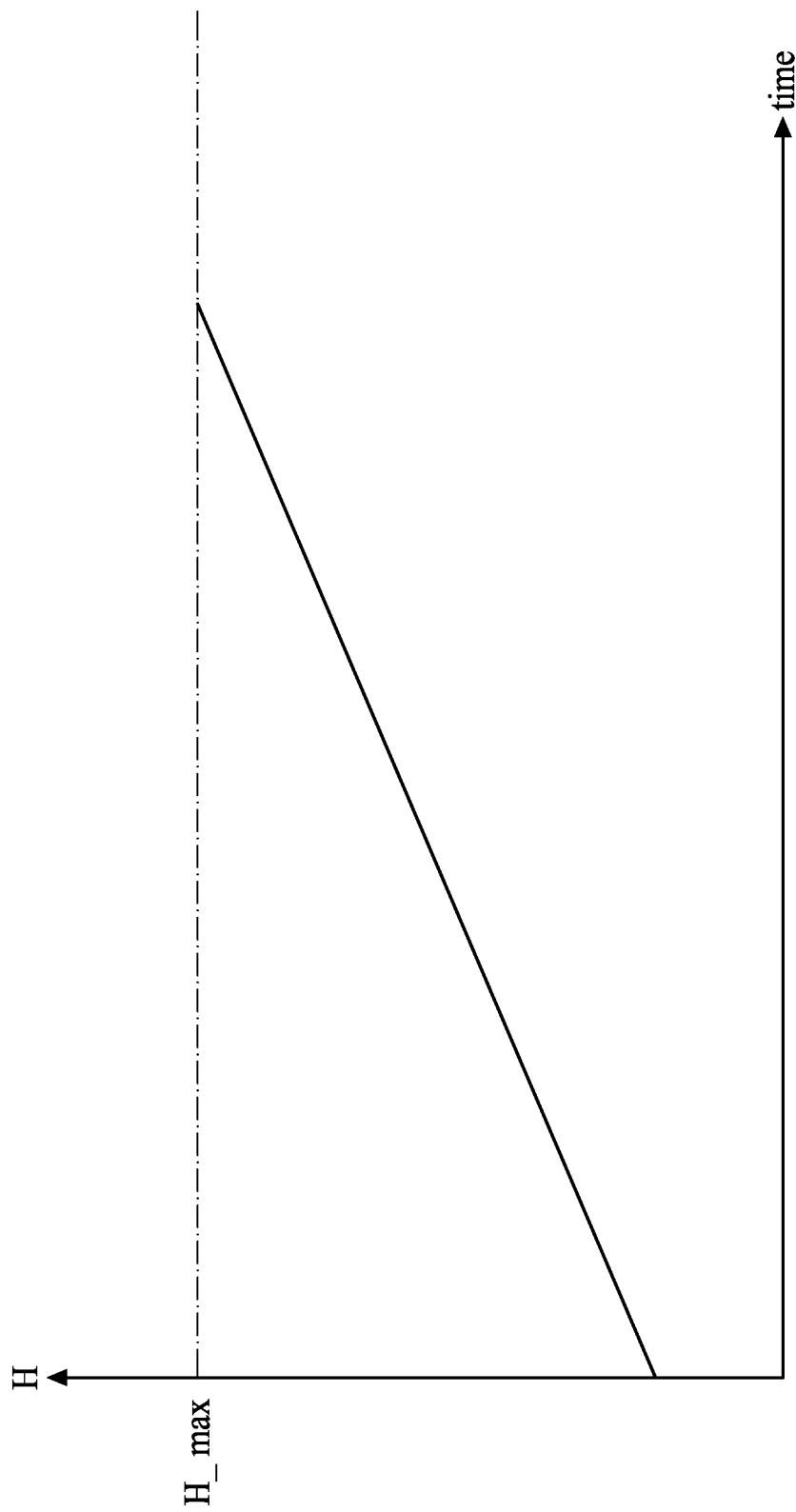
FIG. 7B is a diagram illustrating a relationship between a total plasma etching operation time and a distance between a gas distribution plate and a top surface of a focus ring, according to some embodiments of the present disclosure.
Figure 7B:
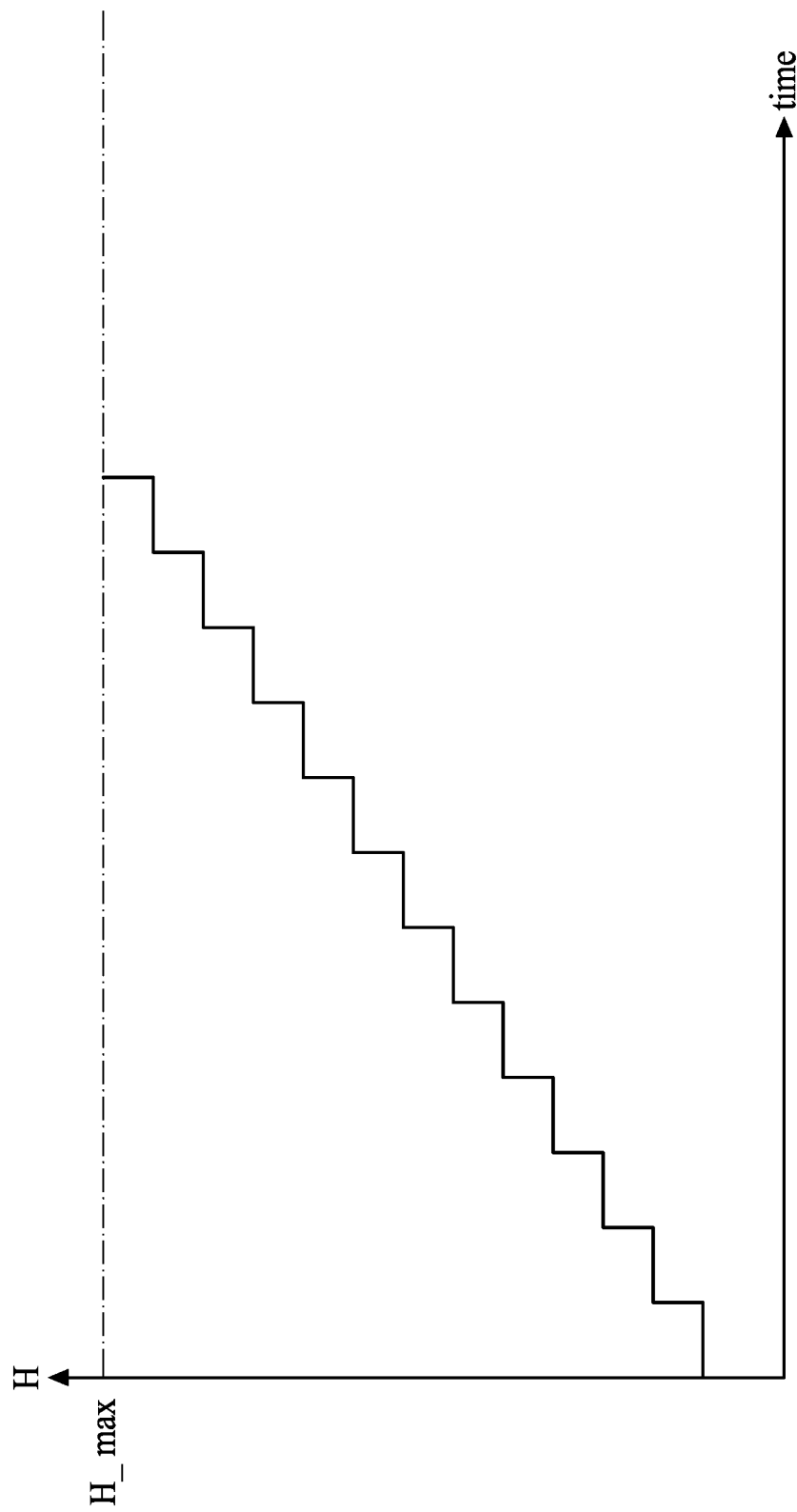

Referring to FIG. 6A, FIG. 6B, FIG. 7A and FIG. 7B, FIG. 7A is a diagram illustrating a relationship between a total plasma etching operation time and a distance between a top surface of an edge ring and a bottom surface of a focus ring, FIG. 7B is a diagram illustrating a relationship between a total plasma etching operation time and a distance between a gas distribution plate and a top surface of a focus ring, according to some embodiments of the present disclosure. During performing the plasma etch operation, the distance S between the top surface of the focus ring 101 and the bottom surface of the GDP 3 is adjusted to be substantially identical with the distance S0 between the top surface of the wafer 9 and the bottom surface of a GDP 3 during the operation time (which is also known as RF hour) by adjusting the voltage supplied to the actuator 200. Accordingly, the gap height between the bottom surface of the focus ring 101 and the top surface of the edge ring 111 is increased during the operation time by adjusting the voltage supplied to the actuator 200. It should be noted that since the maximum displacement of the lift pin 202 may be limited due to the restriction of the material of the piezoelectric layer 201, the gap height between the bottom surface of the focus ring 101 and the top surface of the edge ring 111 may only be able to be increased up to a maximum gap height H_max. For example, the maximum gap height H_max is identical or less than 140 micron. For another example, the maximum gap height H_max is identical or less than 300 micron.

It should be noted that herein in the present disclosure, the operation time (or the total operation time retrospect to the beginning of the operation) is not limited to a single operation performed on one wafer or only one batch of wafers. Operations performing on one wafer, one batch of wafers, multiple wafers, a plurality of batches of wafers, or even within a period of several days/weeks/months may be deemed as within the total operation time. Idle time between each operation may optionally be omitted. In some embodiments, the total operation time can be measured by a tinier of the controller 5. In some embodiments, the preset time schedule obtained/stored by the controller 5 may be implemented according to the timer, and the total operation time is retrospect to an initial reference point (which may be the beginning of a plasma operation in some examples).

In some embodiments, the voltage supplied to the actuator 200 is adjusted based on a preset schedule obtained and/or stored by the controller 5. The controller 5 controls the rate of increasing the distance S between the top surface of the focus ring 101 and the bottom surface of the GDP 3, or the rate of increasing the gap height between the bottom surface of the focus ring 101 and the top surface of the edge ring 111. The preset schedule may be based on experience or the result of wafers 9 previous undergone plasma etch operations. In some embodiments, the magnitude of the voltage supplied to the actuator 200 is positively correlated to a counted period of time obtained by the timer of the controller 5.

Alternatively, the actuator 200 is adjusted based on a feedback provided by a calibrator 8, wherein the calibrator 8 provide feedback based on the distance S between the top surface of the focus ring 101 and a bottom surface of the GDP 3, or alternatively a thickness T of the focus ring 101. In some of the embodiments, the feedback is provided to the controller 5 in real time so the accuracy of controlling the actuator 200 can be improved. In some embodiments, the calibrator 8 may include an acoustic transceiver for obtaining the distance S between the top surface of the focus ring 101 and a bottom surface of the GDP 3. When the distance S between the top surface of the focus ring 101 and a bottom surface of the GDP 3 increases, the gap height between the bottom surface of the focus ring 101 and the top surface of the edge ring 111 is increased to compensate thereof, thereby the distance S can remain substantially identical during plasma etch operation. In some embodiments, the calibrator 8 may include an optical device for obtaining a thickness T of the focus ring 101. When the thickness T of the focus ring 101 decreases, the gap height between the bottom surface of the focus ring 101 and the top surface of the edge ring 111 is increased to compensate the decreased thickness of the focus ring 101, thereby the distance S can remain substantially identical during plasma etch operation.

Referring to FIG. 6A, FIG. 6B, FIG. 7A' and FIG. 7B', FIG. 7A' is a diagram illustrating a relationship between a total plasma etching operation time and a distance between a top surface of an edge ring and a bottom surface of a focus ring, FIG. 7B' is a diagram illustrating a relationship between a total plasma etching operation time and a distance between a gas distribution plate and a top surface of a focus ring, according to some embodiments of the present disclosure. Alternatively, a top surface the lift pin 202 displaces incrementally and/or in accordance with the preset schedule (which may be, or may not be periodically/constantly). Thereby, the distance S between the top surface of the focus ring 101 and the bottom surface of the GDP 3 can be controlled to be less than a threshold value S_max, wherein when the distance S becomes greater than the threshold value S_max, the phenomenon of wafer edge etching profile tilt at a peripheral area of the wafer 9 may be induced. In some embodiments, the top surface the lift pin 202 is lifted up by a distance (while the distance S decreases) before/when the distance S reaches the threshold value S_max. Accordingly, the gap height between the bottom surface of the focus ring 101 and the top surface of the edge ring 111 increases incrementally and/or in accordance with the preset schedule (which may be, or may not be periodically/constantly) and/or a counted period of time obtained by the timer of the controller 5. Alternatively, the actuator 200 is adjusted based on a feedback provided by a calibrator 8, wherein the calibrator 8 provide feedback based on the distance S between the top surface of the focus ring 101 and a bottom surface of the GDP 3, or alternatively a thickness T of the focus ring 101, as previously discussed.

Figure 7C:
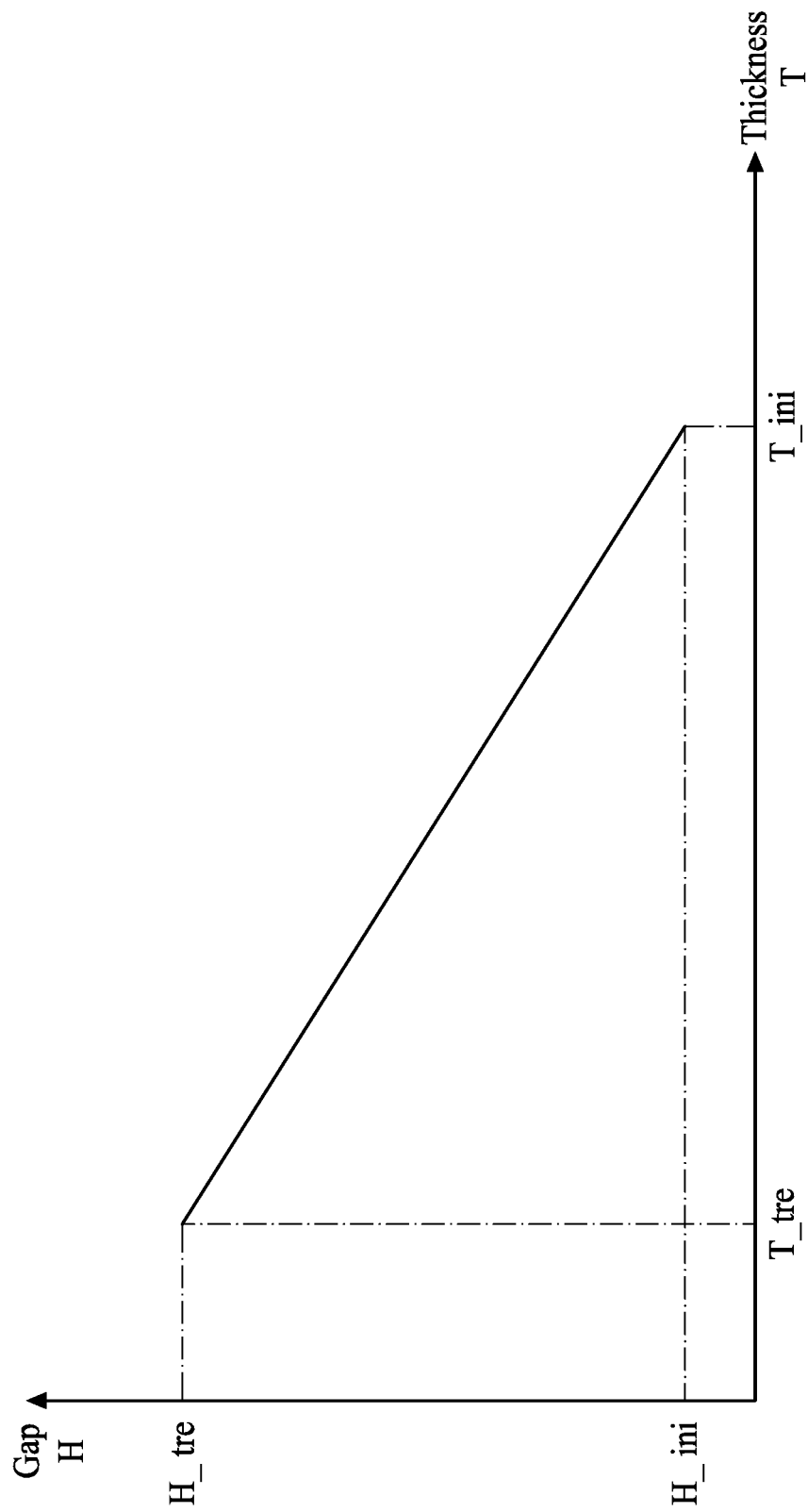
FIG. 7C is a diagram illustrating a relationship between a thickness of a focus ring and a distance between a gas distribution plate and a top surface of a focus ring, according to some embodiments of the present disclosure.

Referring to FIG. 6A, FIG. 6B and FIG. 7C, FIG. 7C is a diagram illustrating a relationship between a thickness of a focus ring and a distance between a gas distribution plate and a top surface of a focus ring, according to some embodiments of the present disclosure. As previously discussed in FIG. 1 and FIG. 3A, a portion of the focus ring 101 may suffer material loss due to the bombardment of plasma ions, whereby a thickness T of the focus ring 101 may decrease during the plasma etch operation. In some embodiments, the voltage supplied to the actuator 200 is negatively correlated to a thickness T of the focus ring 101. Specifically, in order to compensate the material loss of focus ring 101 (e.g. a thickness T of the focus ring 101 decreases from T_ini toward T_tre as shown in FIG. 7C), the gap height H between the bottom surface of the focus ring 101 and the top surface of the edge ring 111 is increased (e.g. a gap H of the focus ring 101 increases from H_ini toward H_tre as shown in FIG. 7C), thereby the distance S between the top surface of the focus ring 101 and a bottom surface of the GDP 3 can be substantially identical with the distance S0 between the GDP 3 and the top surface of the wafer 9, or a difference between the distance S and the distance S0 can be less than a threshold value. However, it should be noted that when the focus ring 101 become too thin, particle issue or reliability issue may be induced. Therefore, when a thickness T of the focus ring 101 reaches (or is about to reach) threshold value t_tre, the plasma etch operation is postponed and the focus ring 101 is replaced, as will be subsequently discussed in FIG. 8A to FIG. 8C.

Figure 8A:
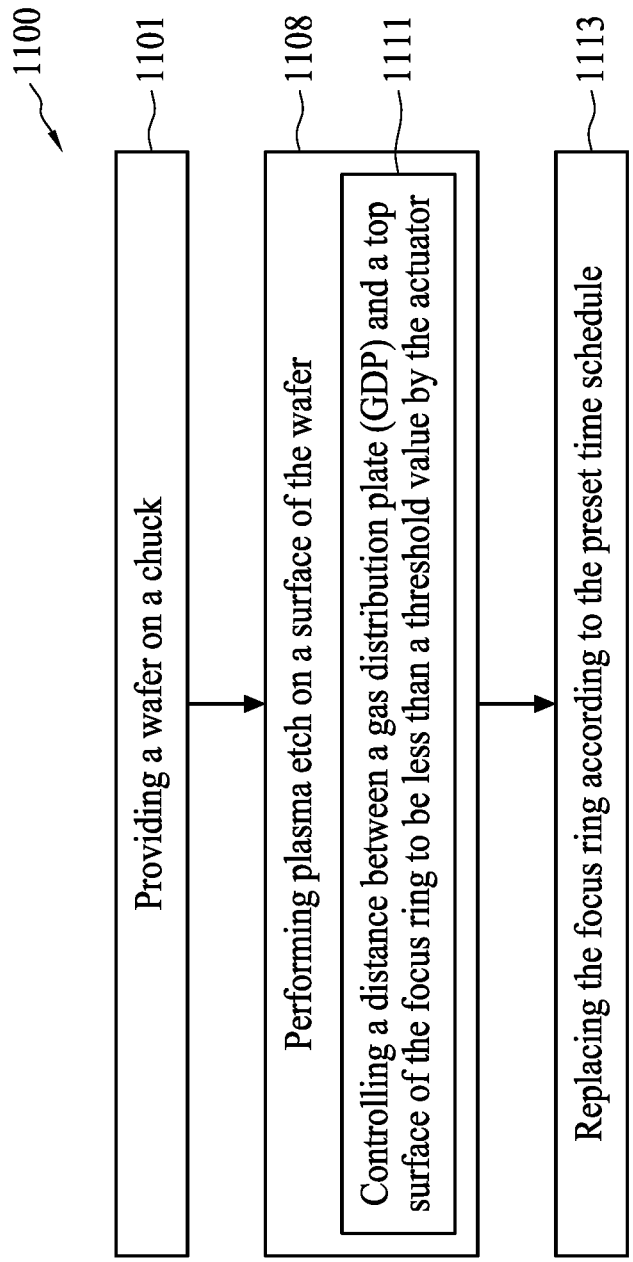
FIG. 8A shows a flow chart representing a method for fabricating a semiconductor structure, in accordance with some embodiments of the present disclosure.
Figure 8B:
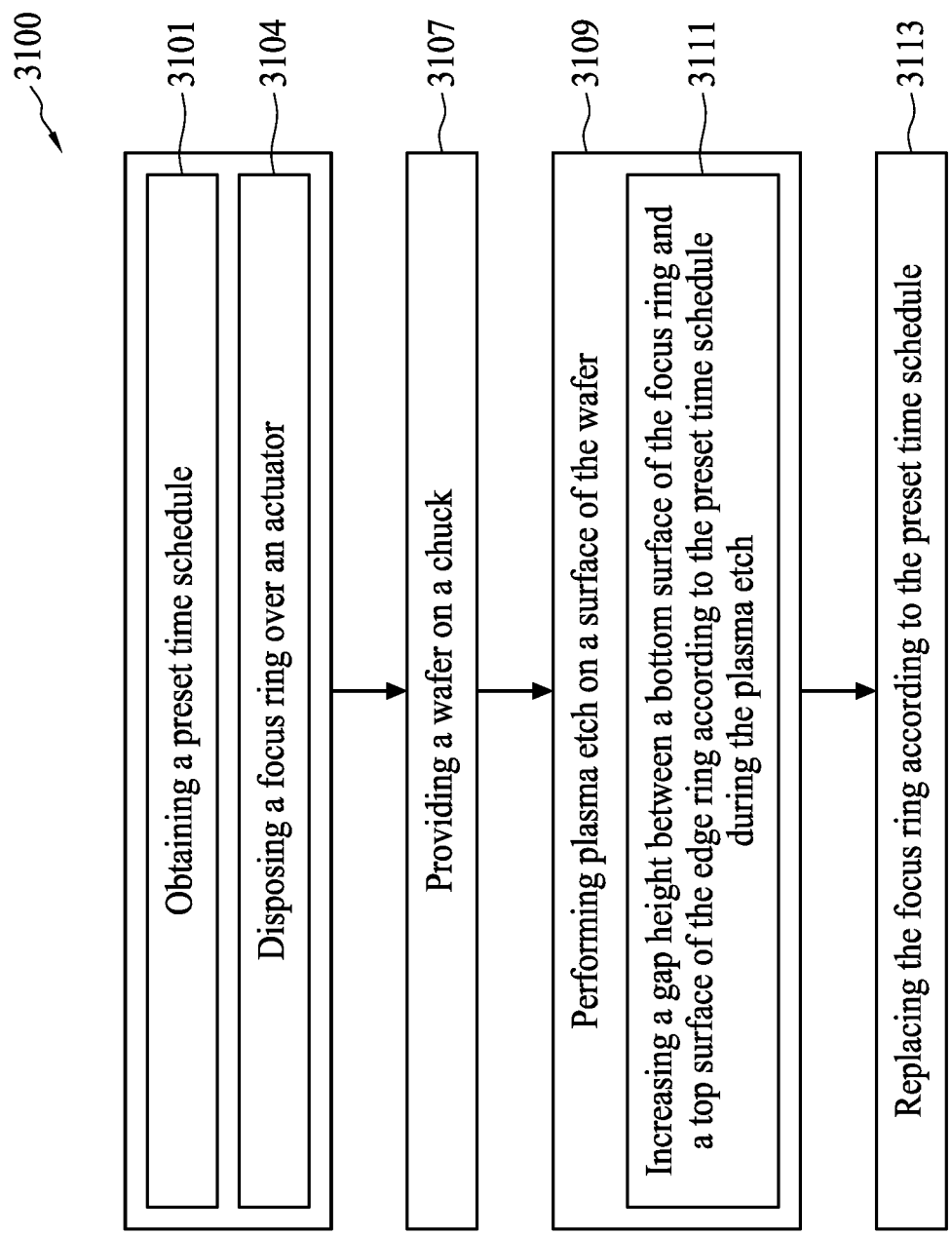
FIG. 8B shows a flow chart representing a method for fabricating a semiconductor structure, in accordance with some embodiments of the present disclosure.
Figure 8C:
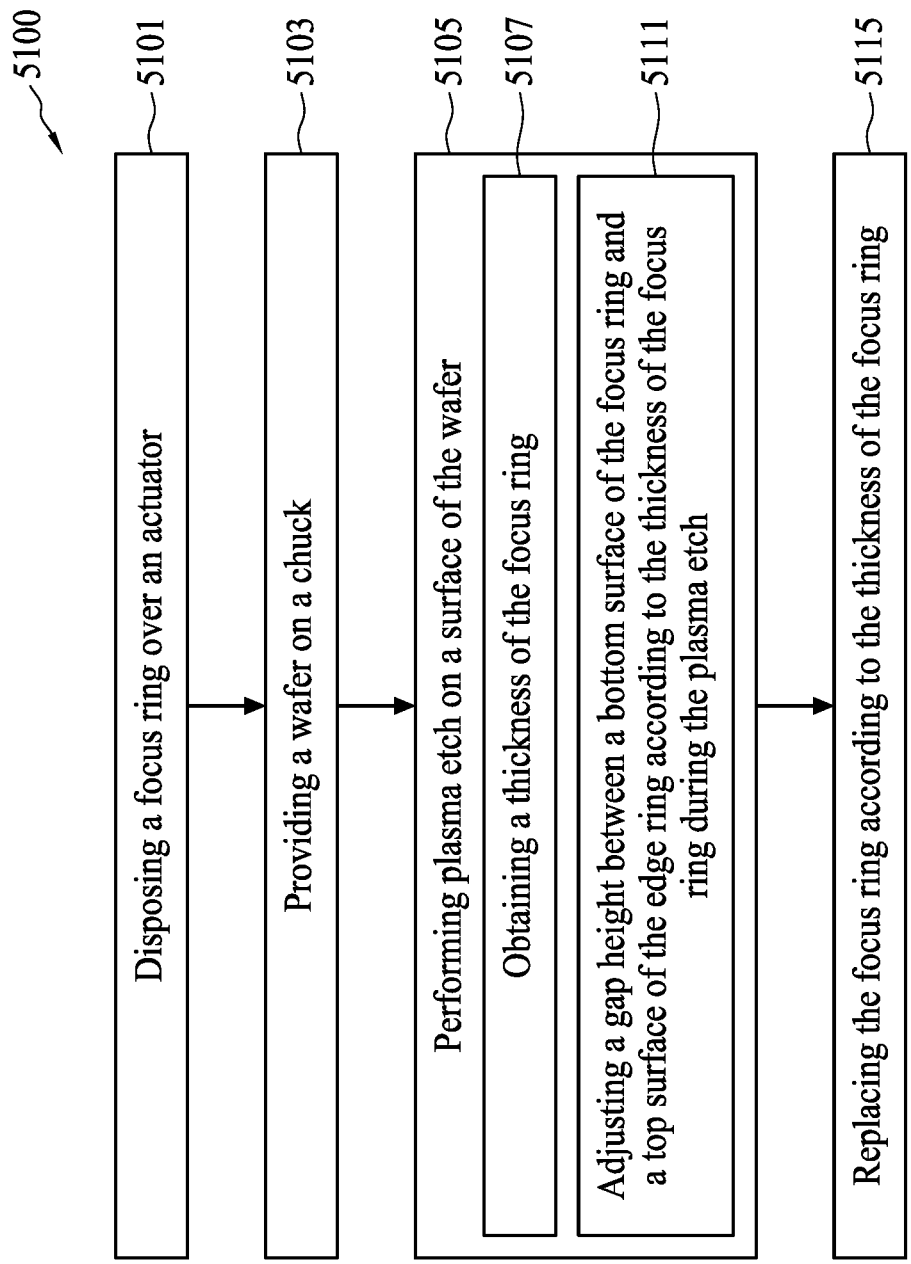
FIG. 8C shows a flow chart representing a method for fabricating a semiconductor structure, in accordance with some embodiments of the present disclosure.

The method(s) and the plasma operation system(s) 1 previously discussed in FIG. 1 to FIG. 7C may increase the life cycle of the focus ring 101 since a relatively thinner focus ring 101 can still be utilized in plasma operation by adjusting its position; and the following method(s) discussed in FIG. 8A to FIG. 8C provide improved control of timing of replacing the focus ring 101.

Referring to FIG. 8A, FIG. 8A shows a flow chart representing a method for fabricating a semiconductor structure, in accordance with some embodiments of the present disclosure. The method 1100 for fabricating a semiconductor structure includes providing a wafer on a chuck (operation 1101, which can be referred to FIG. 1 or FIG. 6A), performing plasma etch on a surface of the wafer (operation 1108, which can be referred to FIG. 6A), and replacing the focus ring according to the preset time schedule (operation 1113). The operation 1108 may include controlling a distance between a gas distribution plate (GDP) and a top surface of the focus ring to be less than a threshold value by the actuator (sub-operation 1111, which can be referred to FIG. 6A to FIG. 6B and FIG. 7A or FIG. 7A').

Referring to FIG. 8B, FIG. 8B shows a flow chart representing a method for fabricating a semiconductor structure, in accordance with some embodiments of the present disclosure. The method 3100 for fabricating a semiconductor structure includes obtaining a preset time schedule (operation 3101, which can be referred to FIG. 6A), disposing a focus ring over an actuator (operation 3104, which can be referred to FIG. 1 or FIG. 6A), providing a wafer on a chuck (operation 3107, which can be referred to FIG. 1 or FIG. 6A), performing plasma etch on a surface of the wafer (operation 3109, which can be referred to FIG. 6A to FIG. 6B), and replacing the focus ring according to the preset time schedule (operation 3113). The operation 3109 may include increasing a gap height between a bottom surface of the focus ring and a top surface of the edge ring according to the preset time schedule during the plasma etch (sub-operation 3111, which can be referred to FIG. 6A to FIG. 6B).

Referring to FIG. 8C, FIG. 8C shows a flow chart representing a method for fabricating a semiconductor structure, in accordance with some embodiments of the present disclosure. The method 5100 for fabricating a semiconductor structure includes disposing a focus ring over an actuator (operation 5101, which can be referred to FIG. 1 or FIG. 6A), providing a wafer on a chuck (operation 5103, which can be referred to FIG. 1 or FIG. 6A), performing plasma etch on a surface of the wafer (operation 5105, which can be referred to FIG. 6A to FIG. 6B), and replacing the focus ring according to the thickness of the focus ring (operation 5115). The operation 5105 may include obtaining a thickness of the focus ring (sub-operation 5107, which can be referred to FIG. 1 and FIG. 6A to FIG. 6B) and adjusting a gap height between a bottom surface of the focus ring and a top surface of the edge ring according to the thickness of the focus ring during the plasma etch (sub-operation 5111, which can be referred to FIG. 6A to FIG. 6B and FIG. 7C).

As previously discussed in FIG. 7C, when a thickness T of the focus ring 101 becomes too thin, particle issues or reliability issue may occurred, therefore the focus ring 101 can be replaced before it becomes too thin. In some embodiments, the timing of replacing a new focus ring 101 may be time-dependent, wherein the timing can be decided by the preset schedule, or by the total operation time counted by the timer of the controller 5. For example, the focus ring 101 is replaced after a certain numbers of batches of wafers 9 had undergone plasma operation (such as plasma etch operation) since the previous time focus ring 101 was replaced. For another example, the focus ring 101 is replaced after certain hours or days of plasma operation (such as plasma etch operation) since the beginning of the plasma etch operation. Alternatively, based on the feedback provided by the calibrator 8, the timing of the focus ring 101 can depend on the thickness T of the focus ring 101. Specifically, when the thickness T of the focus ring 101 reaches (or is about to reach) the threshold value T_tre, the plasma etch operation is postponed and the focus ring 101 is replaced. In some embodiments, prior to replacing the focus ring 101, the voltage supplied to the actuator 200 is decreased (for example, decreased to 0V).

The present disclosure provides a plasma operation apparatus and a method for fabricating a semiconductor structure. Specifically, a portion of the focus ring 101 may suffer material loss due to the bombardment of plasma ions, wherein a thickness T of the focus ring 101 may decrease during the plasma etch operation (or other operation utilizing plasma). In order to compensate the material loss of focus ring 101, the gap height between the bottom surface of the focus ring 101 and the top surface of the edge ring 111 is increased, thereby the distance S between the top surface of the focus ring 101 and a bottom surface of the GDP 3 can be substantially identical with the distance S0 between the GDP 3 and the top surface of the wafer 9, or a difference between the distance S and the distance S0 can be less than a threshold value. The phenomenon of wafer edge etching profile tilt may thereby be alleviated, and/or a life cycle of the focus ring 101 may be extended since the loss of thickness T is compensated thus a thinner focus ring 101 can still be utilized in plasma operation, comparing to a comparative embodiment of not adjusting the position of the focus ring 101 during plasma operation. In addition, as discussed in FIG. 8A to FIG. 8C, the timing of replacing the focus ring 101 can be controlled with improved accuracy. The burden of labor and the time consumed on replacing/monitoring the focus ring 101 may be alleviated.

Furthermore, by using an actuator 200, the position of the focus ring 101 can be controlled by adjusting the voltage supplied thereto. Specifically, by utilizing a piezoelectric transducer as the actuator 200, the accuracy and/or efficiency of controlling over the position of the focus ring 101 may be facilitated.

Some embodiments of the present disclosure provide an apparatus for fabricating a semiconductor structure, including a chuck, an edge ring surrounding the chuck, wherein the edge ring comprises a cavity, a focus ring adjacent to an edge of the chuck and over the edge ring, and a first actuator in the cavity of the edge ring and engaging with the focus ring.

Some embodiments of the present disclosure provide an apparatus for fabricating a semiconductor structure, including a chuck, an edge ring surrounding the chuck, a focus ring adjacent to an edge of the chuck and over the edge ring, and a piezoelectric transducer component engaging with the focus ring.

Some embodiments of the present disclosure provide a method for fabricating a semiconductor structure, including providing a wafer on a chuck, wherein the wafer is surrounded by a focus ring, the focus ring is supported by an actuator and over an edge ring, performing plasma etch on a surface of the wafer, and controlling a distance between a gas distribution plate (GDP) and a top surface of the focus ring to be less than a threshold value by the actuator.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor structure, comprising:
    placing a wafer on a chuck, wherein the wafer is surrounded by a focus ring, the focus ring is supported by a first actuator, wherein the first actuator is in a cavity defined by the chuck and an edge ring, wherein the first actuator comprises:
        an outer ring disposed in the cavity, wherein the outer ring is fixed to the edge ring, and a chamber is defined in the outer ring;
        a piezoelectric layer apart from a top surface of the cavity, wherein an edge of the piezoelectric layer is fixed by the outer ring; and
        an inner ring disposed in the chamber at a center portion of the piezoelectric layer, wherein the inner ring overlaps with the focus ring from a top view perspective;
    performing plasma etch on a surface of the wafer; and
    controlling a distance between a gas distribution plate (GDP) and a top surface of the focus ring to be less than a threshold value by the first actuator.

2. The method of claim 1, further comprising:
    supplying gas through the GDP; and
    increasing a gap height between a bottom surface of the focus ring and a top surface of the edge ring during the plasma etch.

3. The method of claim 2, further comprising increasing the gap height between bottom surface of the focus ring and the top surface of the edge ring according to a preset time schedule.

4. The method of claim 2, further comprising increasing the gap height between the bottom surface of the focus ring and the top surface of the edge ring according to a distance between the GDP and the top surface of the focus ring.

5. The method of claim 4, further comprising obtaining the distance by an acoustic transceiver.

6. The method of claim 5, wherein controlling the distance comprises adjusting a voltage supplied to the first actuator according to the distance obtained by the acoustic transceiver.

7. The method of claim 2, further comprising increasing the gap height between the bottom surface of the focus ring and the top surface of the edge ring according to a thickness of the focus ring.

8. The method of claim 1, wherein controlling the distance between the GDP and the top surface of the focus ring comprises: adjusting a power supplied to the first actuator, thereby a position of the center portion of the piezoelectric layer displaces.

9. A method for fabricating a semiconductor structure, comprising:
    placing a wafer on a chuck, wherein the wafer is surrounded by a focus ring, the focus ring is supported by a first actuator, wherein the first actuator is in a cavity defined by the chuck and an edge ring, wherein the first actuator comprises:
        a piezoelectric layer, wherein a peripheral portion of the piezoelectric layer is fixed, and a bottom surface of the piezoelectric layer is apart from a first portion of the chuck and a first portion of the edge ring along a vertical direction;
        a lift pin, placed over the piezoelectric layer; and
        an inner ring, wherein the inner ring bears the lift pin, and the inner ring is at least partially surrounded by the piezoelectric layer laterally;
    performing plasma etch on a surface of the wafer; and
    adjusting a power supplied to the first actuator to adjust a vertical position of the center portion of the piezoelectric layer.

10. The method of claim 9, wherein the first actuator further comprises an insulation ring disposed in the cavity.

11. The method of claim 10, wherein the first portion of the chuck and the first portion of the edge ring are under a coverage of a vertical projection area of the insulation ring.

12. The method of claim 10, wherein the peripheral portion of the piezoelectric layer is fixed by the insulation ring.

13. The method of claim 9, further comprising controlling a distance between a gas distribution plate (GDP) and a top surface of the focus ring to be less than a threshold value by the first actuator.

14. A method for fabricating a semiconductor structure, comprising:
    placing a wafer on a chuck, wherein the wafer is surrounded by a focus ring, the focus ring is supported by a first actuator, wherein the first actuator is in a cavity defined by the chuck and an edge ring, wherein the first actuator comprises:
        an outer ring disposed in the cavity, wherein the outer ring is fixed to the edge ring, and a chamber is defined in the outer ring;
        a piezoelectric layer apart from a top surface of the cavity, wherein an edge of the piezoelectric layer is fixed by the outer ring; and
        an inner ring disposed in the chamber at a center portion of the piezoelectric layer, wherein the inner ring overlaps with the focus ring from a top view perspective;
    performing plasma etch on a surface of the wafer; and
    adjusting a vertical position of the inner ring during the plasma etch.

15. The method of claim 14, further comprising replacing the focus ring with another focus ring according to a preset time schedule.

16. The method of claim 14, further comprising increasing a gap height between a bottom surface of the focus ring and a top surface of the edge ring during the plasma etch.

17. The method of claim 14, wherein the focus ring is detachable from the first actuator.

18. The method of claim 14, wherein the vertical position of the inner ring is adjusted by adjusting a power supplied to the first actuator.

19. The method of claim 18, wherein a magnitude of voltage of the power supplied to the first actuator is positively correlated to a counted period of time obtained by a timer.

20. The method of claim 14, wherein a pressure in the chamber is less than 100 mTorr.

* * * * *